US011210001B2

(12) United States Patent
Yang et al.

(10) Patent No.: US 11,210,001 B2
(45) Date of Patent: Dec. 28, 2021

(54) STORAGE DEVICE PARAMETER MONITORING FOR LOAD BALANCING

(71) Applicant: Western Digital Technologies, Inc., San Jose, CA (US)

(72) Inventors: Niles Yang, Mountain View, CA (US); Phil Reusswig, Mountain View, CA (US); Sahil Sharma, San Jose, CA (US); Rohit Sehgal, San Jose, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 28 days.

(21) Appl. No.: 16/855,549

(22) Filed: Apr. 22, 2020

(65) Prior Publication Data

US 2021/0334030 A1     Oct. 28, 2021

(51) Int. Cl.
| | |
|---|---|
| *G06F 12/00* | (2006.01) |
| *G06F 3/06* | (2006.01) |
| *G11C 16/34* | (2006.01) |
| *G06F 13/00* | (2006.01) |
| *G06F 13/28* | (2006.01) |

(52) U.S. Cl.
CPC .......... *G06F 3/0635* (2013.01); *G06F 3/064* (2013.01); *G06F 3/067* (2013.01); *G06F 3/0619* (2013.01); *G11C 16/349* (2013.01)

(58) Field of Classification Search
CPC ...... G06F 3/0635; G06F 3/0619; G06F 3/064; G06F 3/067; G11C 16/349
See application file for complete search history.

(56) References Cited

U.S. PATENT DOCUMENTS

| | | | |
|---|---|---|---|
| 10,452,468 B2 | 10/2019 | Chu et al. | |
| 10,891,201 B1* | 1/2021 | Kozlovsky | .......... G06F 11/1469 |
| 2017/0206026 A1 | 7/2017 | Narayanan et al. | |
| 2018/0373437 A1 | 12/2018 | Navon et al. | |
| 2019/0108888 A1 | 4/2019 | Sarkar et al. | |
| 2019/0114276 A1 | 4/2019 | Hodes et al. | |
| 2019/0179559 A1 | 6/2019 | Bolkhovitin et al. | |
| 2020/0026597 A1 | 1/2020 | Chu et al. | |
| 2020/0287962 A1* | 9/2020 | Mishra | ................ H04L 67/1031 |
| 2021/0182188 A1* | 6/2021 | Ilic | ...................... G06F 11/3034 |

\* cited by examiner

*Primary Examiner* — Mark A Giardino, Jr.
(74) *Attorney, Agent, or Firm* — Patent Law Works LLP

(57) ABSTRACT

Systems and methods for storage systems using storage device monitoring for load balancing are described. Storage devices may be configured for data access through a common data stream, such as the storage devices in a storage node or server. Data operations from the common data stream may be distributed among the storage devices using a load balancing algorithm. Performance parameter values, such as grown bad blocks, program-erase cycles, and temperature, may be received for the storage devices and used to determine variance values for each storage device. Variance values demonstrating degrading storage devices may be used to reduce the load allocation of data operations to the degrading storage devices.

20 Claims, 7 Drawing Sheets

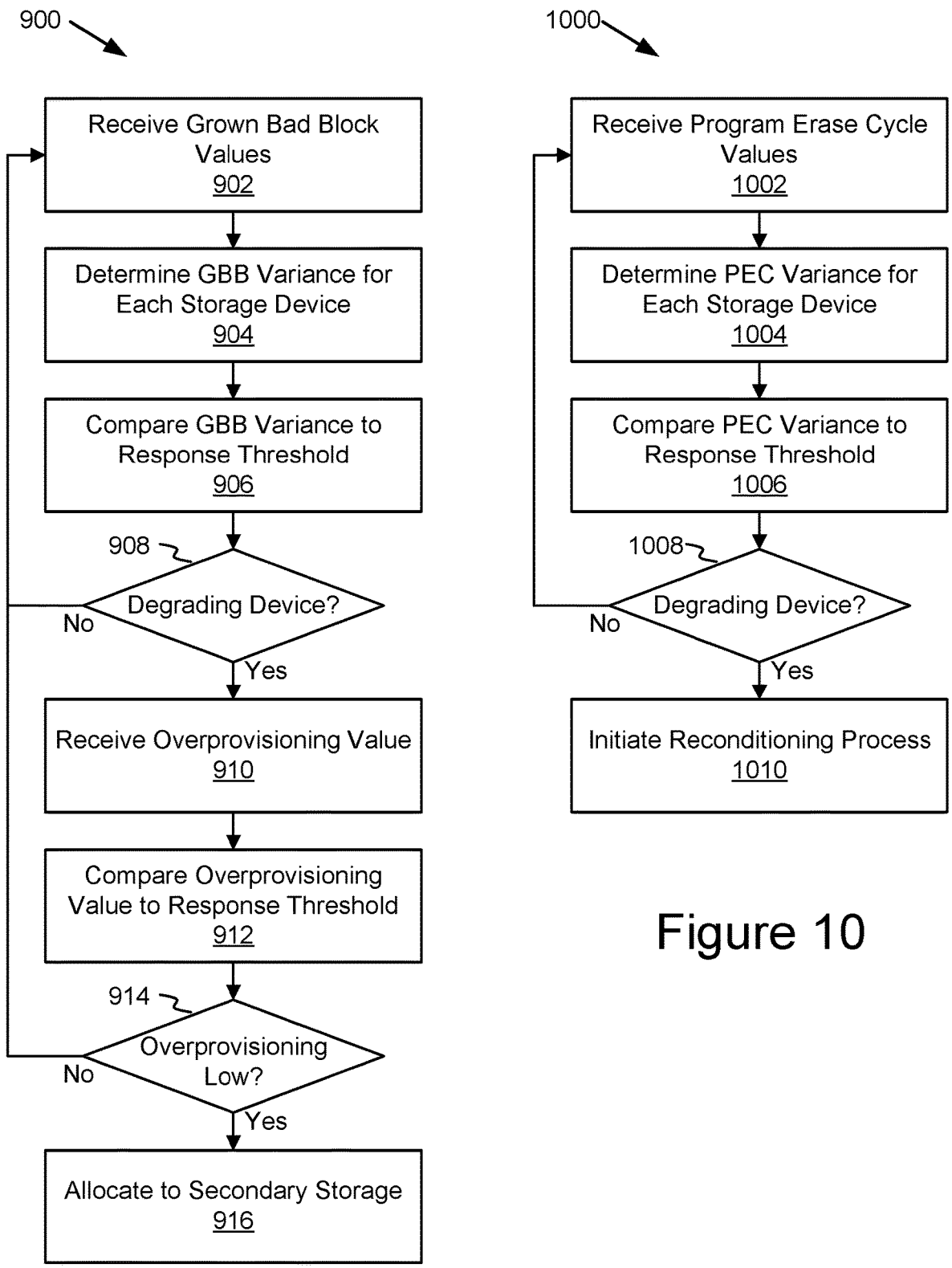

STORAGE DEVICE PARAMETER MONITORING FOR LOAD BALANCING

TECHNICAL FIELD

The present disclosure generally relates to distributed data storage systems and, more particularly, to load balancing for distributing data operations across storage devices.

BACKGROUND

Object storage systems are able to surpass the maximum limits for storage capacity of file systems in a flexible way such that, for example, storage capacity can be added or removed in function of the needs, without degrading its performance as the system grows. This makes such object storage systems excellent candidates for large scale storage systems.

Such large-scale storage systems are required to distribute the stored data objects in the object storage system over multiple storage devices, such as for example solid-state drives (SSDs), configured in storage nodes, storage servers, data centers, etc. However, as the number of storage elements in such a distributed object storage system increase, the probability of degradation and, ultimately, failure of one or more of these storage devices increases equally. To cope with this, it is required to introduce a level of redundancy into the distributed object storage system and to manage the distributions of data operations from a common data stream across the storage devices of the distributed storage system. The distributed object storage system must be able to cope with a failure of one or more storage elements without data loss, as well as maintain operational efficiency and required service levels for processing additional data operations.

In its simplest form redundancy is achieved by replication, this means storing multiple copies of a data object on multiple storage elements of the distributed object storage system. In this way when one of the storage elements storing a copy of the data object fails, this data object can still be recovered from another storage element holding a copy. Several schemes for replication are known in the art. In general replication is costly as the storage capacity is concerned and may also entail various levels of processing overhead. Some distributed object storage systems may use erasure coding to store the data object in encoded subblocks that are spread amongst the storage elements.

Such distributed storage systems may rely on storage devices grouped in a storage node, storage rack, storage server, or other storage element to perform at similar levels in terms of input/output (I/O) processing and capacity. A storage system manager may include one or more load balancing schemes that attempt to maintain consistency of the data center data stream rate and data traffic latency times. However, individual storage devices may not have performance that is consistent across program/erase (PE) cycles, as well as drive-to-drive performance variations across ambient condition changes, such as temperature, voltage, and electromagnetic (EM) noise levels. This may lead to inconsistency in the performance from these individual storage devices that are not ideal for distributed storage system operations.

There may be an ongoing need for storage systems that alleviate storage device, particularly SSD, performance variation to enable more consistent load balancing and delivery of expected service levels.

SUMMARY

Various aspects for storage systems, particularly, using storage device parameter monitoring for load balancing across a population of storage devices are described.

One general aspect includes a storage system that includes: a storage system manager configured to manage a plurality of storage devices configured for data access through a common data stream, and distribute data operations from the common data stream to the plurality of storage devices; a storage device monitor configured to receive, for each storage device of the plurality of storage devices, a grown bad block value, determine, for each storage device of the plurality of storage devices, a first variance value based on grown bad block values from the plurality of storage devices, and determine, based on the first variance value, a degrading storage device has increased grown bad blocks relative to the plurality of storage devices; and a load balancer configured to determine, using a load balancing algorithm, target storage devices among the plurality of storage devices to receive data operations from the common data stream and reduce, responsive to the determination of the degrading storage device, a load allocation of data operations distributed to the degrading storage device.

Implementations may include one or more of the following features. The storage device monitor may be further configured to: receive an overprovisioning value for the degrading storage device; and determine, based on the overprovisioning value, the degrading storage device has remaining overprovisioning space below an overprovisioning response threshold. The load balancer may be further configured to: allocate, responsive to remaining overprovisioning space below the overprovisioning response threshold, the degrading storage device to a secondary storage status; and skip the degrading storage device for distribution of write data operations from the common data stream. The load balancing algorithm may be configured to distribute data operations evenly across the plurality of storage devices by selecting target storage devices for data operations based on load allocation values for each storage device of the plurality of storage devices and reducing the load allocation of data operations distributed to the degrading storage device may be based on changing a load allocation value for the degrading storage device in the load balancing algorithm. The storage device monitor may be further configured to: receive, for each storage device of the plurality of storage devices, a program erase cycle value; determine, for each storage device of the plurality of storage devices, a second variance value based on program erase cycle values from the plurality of storage devices; and determine, based on the second variance value, the degrading storage device has increased program erase cycles relative to the plurality of storage devices. The storage system manager may be further configured to initiate, responsive to the degrading storage device having increased program erase cycles, a reconditioning process to rewrite data blocks stored on the degrading storage device to the degrading storage device. The storage device monitor may be further configured to: receive, for each storage device of the plurality of storage devices, a temperature value; determine, for each storage device of the plurality of storage devices, a third variance value based on temperature values from the plurality of storage devices; and determine, based on the third variance value, the degrading storage device has increased temperature relative to the plurality of storage devices. The storage system manager may be further configured to initiate, responsive to the degrading storage device having increased temperature, an environmental change notification to a cooling system associated with the plurality of storage devices. The load balancer may be further configured to identify a set of data blocks having associated data operations above a hot data threshold and allocate the set of data blocks across each of the plurality of storage devices, excluding the degrading storage device. The load balancer may be further configured to rotate the set of data blocks from an initial storage device to the plurality of storage devices, excluding the degrading storage device, where the load balancer selected the initial storage device to receive the associated data operations for the set of data blocks. The system may further include a storage device performance parameter table configured to store, for each storage device of the plurality of storage devices, performance parameters received from the plurality of storage devices. The storage device monitor may be further configured to determine the first variance value based on aggregating each grown bad block value in successive table entries for each storage device of the plurality of storage devices and comparing each grown bad block value to an aggregate value to determine the first variance value for each storage device of the plurality of storage devices. The performance parameters may include at least one of: grown bad block values; program erase cycle values; temperature values; and data operations values.

Another general aspect includes a computer-implemented method that includes: managing a plurality of storage devices configured for data access through a common data stream; distributing data operations from the common data stream to the plurality of storage devices; determining, using a load balancing algorithm, target storage devices among the plurality of storage devices to receive data operations from the common data stream; receiving, for each storage device of the plurality of storage devices, a grown bad block value; determining, for each storage device of the plurality of storage devices, a first variance value based on grown bad block values from the plurality of storage devices; determining, based on the first variance value, a degrading storage device has increased grown bad blocks relative to the plurality of storage devices; and reducing, responsive to determining the degrading storage device, a load allocation of data operations distributed to the degrading storage device.

Implementations may include one or more of the following features. The computer-implemented method may include: receiving an overprovisioning value for the degrading storage device; determining, based on the overprovisioning value, the degrading storage device has remaining overprovisioning space below an overprovisioning response threshold; allocating, responsive to remaining overprovisioning space below the overprovisioning response threshold, the degrading storage device to a secondary storage status; and skipping, based on the secondary storage status, the degrading storage device for distribution of write data operations from the common data stream. Determining target storage devices may include distributing data operations evenly across the plurality of storage devices by selecting target storage devices for data operations based on load allocation values for each storage device of the plurality of storage devices and reducing the load allocation of data operations distributed to the degrading storage device is based on changing a load allocation value for the degrading storage device in the load balancing algorithm. The computer-implemented method may include: receiving, for each storage device of the plurality of storage devices, a program erase cycle value; determining, for each storage device of the plurality of storage devices, a second variance value based on program erase cycle values from the plurality of storage devices; and determining, based on the second variance value, the degrading storage device has increased program erase cycles relative to the plurality of storage devices. The computer-implemented method may include initiating, responsive to the degrading storage device having increased program erase cycles, a reconditioning process to rewrite data blocks stored on the degrading storage device to the degrading storage device. The computer-implemented method may include: receiving, for each storage device of the plurality of storage devices, a temperature value; determining, for each storage device of the plurality of storage devices, a third variance value based on temperature values from the plurality of storage devices; and determining, based on the third variance value, the degrading storage device has increased temperature relative to the plurality of storage devices. The computer-implemented method may include initiating, responsive to the degrading storage device having increased temperature, an environmental change notification to a cooling system associated with the plurality of storage devices. The computer-implemented method may include: identifying a set of data blocks having associated data operations above a hot data threshold; and allocating the set of data blocks across each of the plurality of storage devices, excluding the degrading storage device. The computer-implemented method may include rotating, from an initial storage device among the plurality of storage devices, the set of data blocks to the plurality of storage devices, excluding the degrading storage device, where the initial storage device received the associated data operations for the set of data blocks.

Another general aspect includes a system that includes: a plurality of storage devices configured for data access through a common data stream; means for distributing data operations from the common data stream to the plurality of storage devices; means for determining, using a load balancing algorithm, target storage devices among the plurality of storage devices to receive data operations from the common data stream; means for receiving, for each storage device of the plurality of storage devices, a grown bad block value; means for determining, for each storage device of the plurality of storage devices, a first variance value based on grown bad block values from the plurality of storage devices; means for determining, based on the first variance value, a degrading storage device has increased grown bad blocks relative to the plurality of storage devices; and means for reducing, responsive to determining the degrading storage device, a load allocation of data operations distributed to the degrading storage device.

The various embodiments advantageously apply the teachings of distributed storage networks and/or systems to improve the functionality of such computer systems. The various embodiments include operations to overcome or at least reduce the issues previously encountered on the storage networks and/or systems and, accordingly, are more reliable and/or efficient than other computing networks. That is, the various embodiments disclosed herein include hardware and/or software with functionality to improve the management of load balancing across storage devices in a data center, such as by using performance parameters collected from the storage devices to identify variances across the storage devices and compensate for those variances in load balancing and other data center management schemes. Accordingly, the embodiments disclosed herein provide various improvements to storage networks and/or storage systems.

It should be understood that language used in the present disclosure has been principally selected for readability and instructional purposes, and not to limit the scope of the subject matter disclosed herein.

BRIEF DESCRIPTION OF THE DRAWINGS

FIG. 9 is a flowchart of an example method of using grown bad blocks to manage degrading storage devices.

FIG. 10 is a flowchart of an example method of using program erase cycles to manage degrading storage devices.

DETAILED DESCRIPTION

Figure 1:
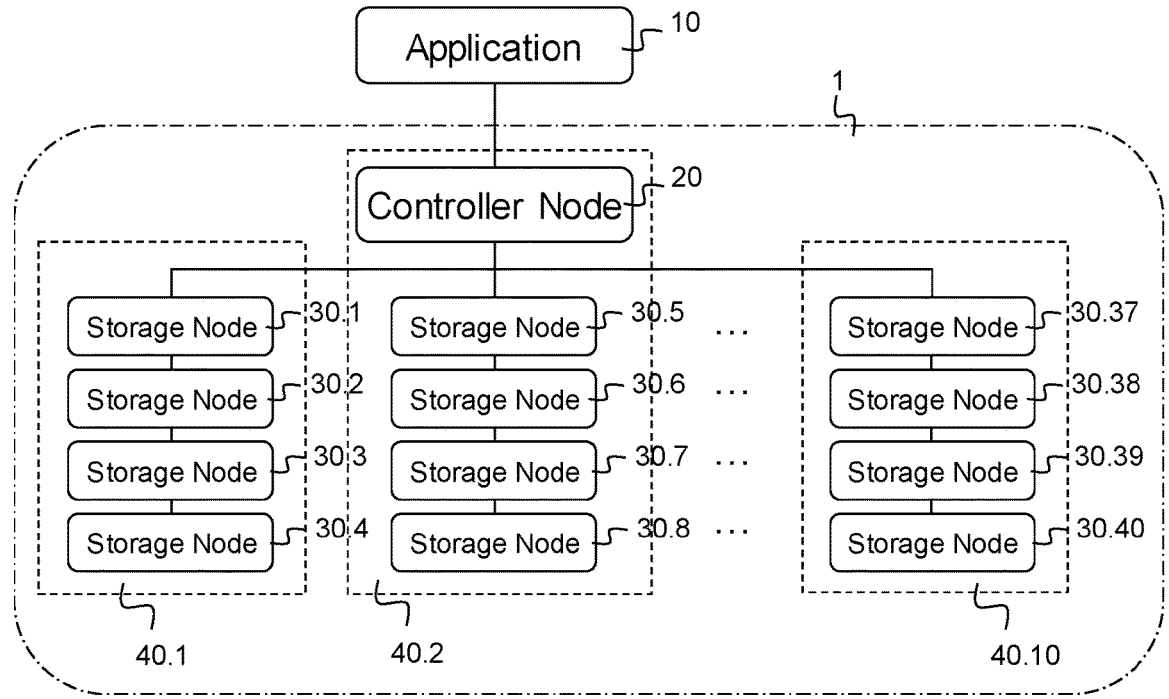
FIG. 1 schematically illustrates a distributed object storage system.

FIG. 1 shows a storage system 1, such as a distributed object storage system. It is connected to an application 10 for transferring data objects. This connection may be implemented as a suitable data communication network. Such an application could for example be a dedicated software application running on a computing device, such as a personal computer, a lap top, a wireless telephone, a personal digital assistant or any other type of communication device, that is able to interface directly with the distributed object storage system 1, but said application 10 may alternatively comprise a suitable file system which enables a general purpose software application to interface with the distributed object storage system 1 or an Application Programming Interface (API) library. As further shown in FIG. 1, the distributed object storage system comprises a controller node 20 and a plurality of storage nodes 30.1-30.40 all interconnected in a suitable way for transferring data, for example by means of a conventional data communication network such as a local area network (LAN), a wide area network (WAN), a telephone network, such as the Public Switched Telephone Network (PSTN), an intranet, the internet, any other suitable network or combination of networks. Controller nodes 20, storage nodes 30 and the device comprising application 10 may connect to said data communication network by wired, wireless and/or optical connections.

The distributed object storage system may comprise any other suitable number of storage nodes 30 and for example two three or more controller nodes 20 also connected to these storage nodes 30. These controller nodes 20 and storage nodes 30 can be built as general-purpose computers, however more frequently they are physically adapted for arrangement in large data centers, where they are arranged in modular racks 40 comprising standard dimensions. Particular controller nodes 20 and storage nodes 30, are dimensioned to take up a single unit of such rack 40, which is generally referred to as 1 U.

As shown in FIG. 1 several storage nodes 30 can be grouped together, for example because they are housed in a single rack 40. For example, storage nodes 30.1-30.4; 30.5-30.8; . . . ; and 30.37-30.40 each are respectively grouped into racks 40.1, 40.2, . . . 40.10. Controller node 20 could, for example, be located in rack 40.2. These racks may not be required to be located at the same location, they are often geographically dispersed across different data centers, such as for example rack 40.1 can be located at a data center in Europe, 40.2 at a data center in the USA and 40.10 at a data center in China. Similarly, these racks may be interconnected by a variety of network architectures and may include multiple network paths, global networks (e.g., internet), private networks, virtual networks, subnetworks, etc. and related networking equipment.

Figure 2:
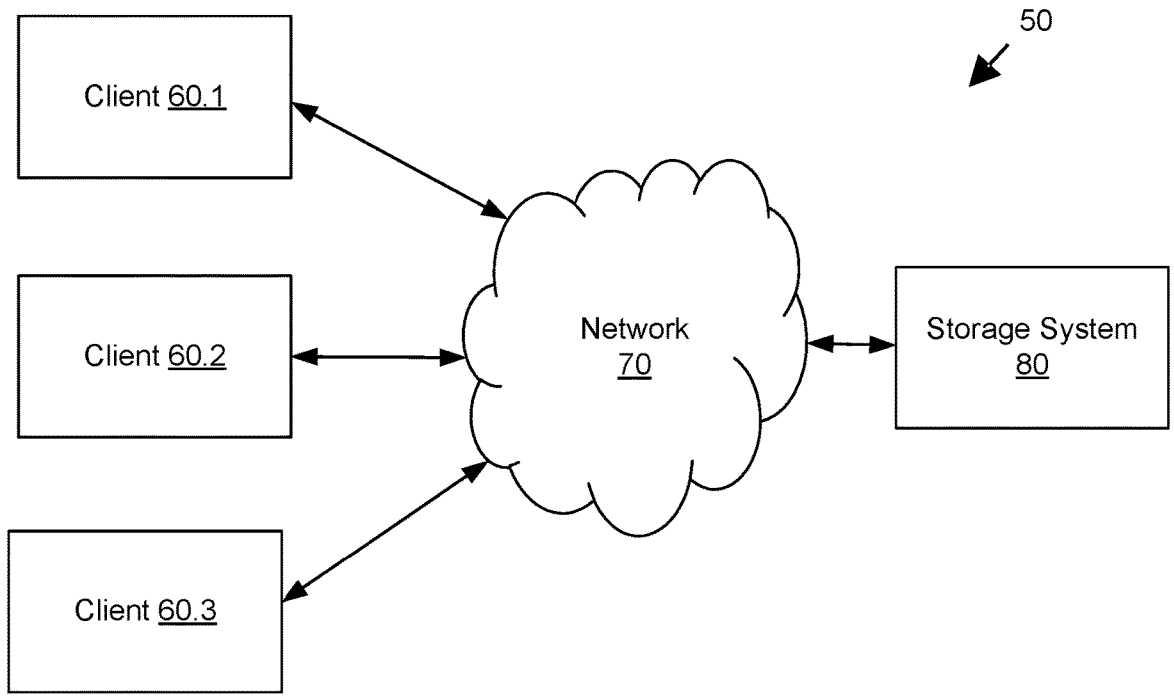
FIG. 2 schematically illustrates a client/server architecture that may be used by the distributed object storage system of FIG. 1.

FIG. 2 is a block diagram of an example storage network 50 using a client architecture. In some embodiments, distributed storage system 1 may be embodied in such a storage network 50. As shown, storage network 50 can include multiple client devices 60 capable of being coupled to and in communication with a storage network 50 via a wired and/or wireless network 70 (e.g., public and/or private computer networks in any number and/or configuration (e.g., the Internet, an intranet, a cloud network, etc.)), among other examples that may include one client device 60.1 or two or more client devices 60 (e.g., is not limited to three client devices 60.1-60.3).

A client device 60 can be any computing hardware and/or software (e.g., a thick client, a thin client, or hybrid thereof) capable of accessing storage system 80 utilizing network 70. Each client device 60, as part of its respective operation, relies on sending input/output (I/O) requests to storage system 80 to write data, read data, and/or modify data. Specifically, each client device 60 can transmit I/O requests to read, write, store, communicate, propagate, and/or transport instructions, data, computer programs, software, code, routines, etc., to storage system 80. Client device(s) 60 and storage system 80 may comprise at least a portion of a client-server model. In general, storage system 80 can be accessed by client device(s) 60 and/or communication with storage system 80 can be initiated by client device(s) 60 through a network socket (not shown) utilizing one or more inter-process networking techniques. In some embodiments, client devices 60 may access one or more applications to use or manage a distributed storage system, such as distributed storage system 1 in FIG. 1.

Figure 3:
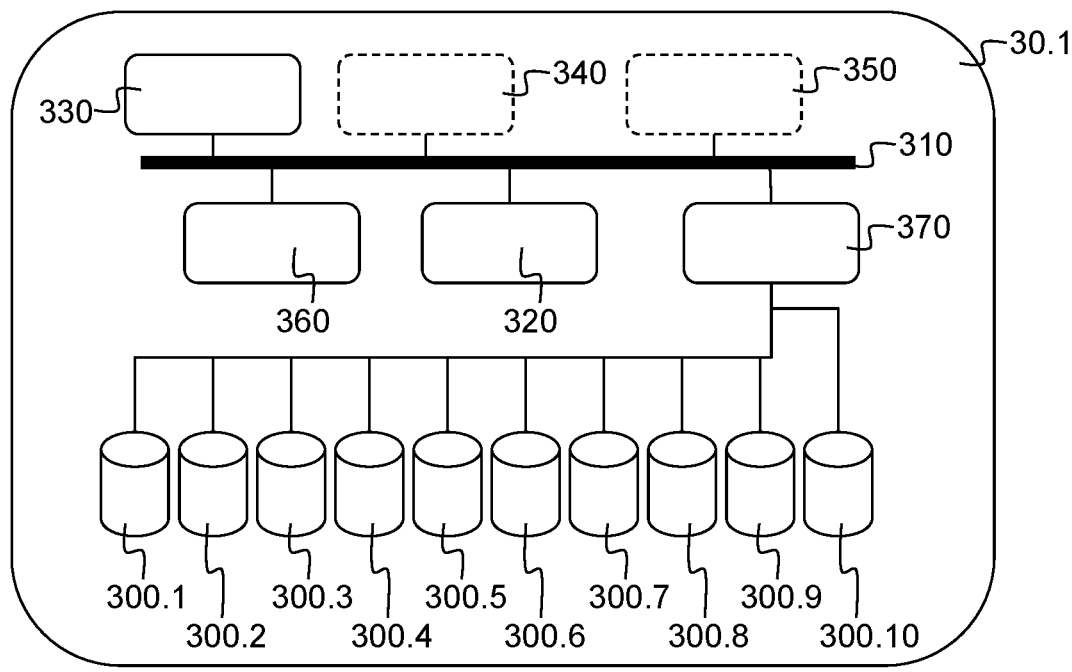
FIG. 3 schematically illustrates a storage node of the distributed object storage system of FIG. 1.

FIG. 3 shows a schematic representation of one of the storage nodes 30. Storage node 30.1 may comprise a bus 310, a processor 320, a local memory 330, one or more optional input units 340, one or more optional output units 350, a communication interface 360, a storage element interface 370 and a plurality of storage elements 300.1-300.10. Bus 310 may include one or more conductors that permit communication among the components of storage node 30.1. Processor 320 may include any type of conventional processor or microprocessor that interprets and executes instructions. Local memory 330 may include a random-access memory (RAM) or another type of dynamic storage device that stores information and instructions for execution by processor 320 and/or a read only memory (ROM) or another type of static storage device that stores static information and instructions for use by processor 320. Input unit 340 may include one or more conventional mechanisms that permit an operator to input information to said storage node 30.1, such as a keyboard, a mouse, a pen, voice recognition and/or biometric mechanisms, etc. Output unit 350 may include one or more conventional mechanisms that output information to the operator, such as a display, a printer, a speaker, etc. Communication interface 360 may include any transceiver-like mechanism that enables storage node 30.1 to communicate with other devices and/or systems, for example mechanisms for communicating with other storage nodes 30 or controller nodes 20 such as for example two 1 Gb Ethernet interfaces. Storage element interface 370 may comprise a storage interface such as for example a Serial Advanced Technology Attachment (SATA) interface or a Small Computer System Interface (SCSI) for connecting bus 310 to one or more storage elements 300, such as one or more local disks, for example, 2 TB SATA-II disk drives, and control the reading and writing of data to/from these storage elements 300. As shown in FIG. 3, such a storage node 30.1 could comprise ten 2 TB SATA-II disk drives as storage elements 300.1-300.10 and in this way storage node 30.1 would provide a storage capacity of 20 TB to the distributed object storage system 1. According to FIG. 1 and in the event that storage nodes 30.2-30.40 are identical to storage node 30.1, the distributed object storages system 1 would then have a total storage capacity of 800 TB.

Taking into account FIG. 1 and FIG. 3, the distributed object storage system 1 comprises a plurality of redundant storage elements 300. The storage nodes 30 each comprise a share of these storage elements 300. As shown in FIG. 1, storage node 30.1 comprises ten storage elements 300.1-300.10. Other storage nodes 30 could comprise a similar amount of storage elements, but this is however not essential. Storage node 30.2 could for example comprise eight storage elements 300.11-300.18 (not shown). As will be explained in further detail below, the distributed object storages system 1 is operable to store and retrieve a data object comprising data, for example 64 megabytes (MB) of binary data and a data object identifier for addressing this data object, for example a universally unique identifier such as a globally unique identifier (GUID). Storing the data offered for storage by the application 10 in the form of a data object, also referred to as object storage, has specific advantages over other storage schemes such as conventional block based storage or conventional file based storage, such as scalability and flexibility, which are of particular importance in a distributed object storage system 1 that is directed to large scale redundant storage applications, sometimes also referred to as cloud storage.

The storage elements 300 are redundant and operate independently of one another. This means that if one particular storage element 300 fails its function can easily be taken on by another storage element 300 in the distributed storage system. However, as will be explained in more detail further below, there is no need for the storage elements 300 to work in synchronism, as is for example the case in many well-known RAID configurations, which sometimes even require disk spindle rotation to be synchronized. Furthermore, the independent and redundant operation of the storage elements 300 allows to use any suitable mix of types storage elements 300 to be used in a particular distributed object storage system 1. It is possible to use for example storage elements with differing storage capacity, storage elements of differing manufacturers, using different hardware technology such as for example conventional hard disks and solid-state storage elements, using different storage interfaces such as for example different revisions of SATA, SCSI, and so on. All this results in specific advantages for scalability and flexibility of the distributed object storage system 1 as it allows to add or remove storage elements 300 without imposing specific requirements to their design in correlation to other storage elements 300 already in use in that distributed object storage system 1.

Figure 4:
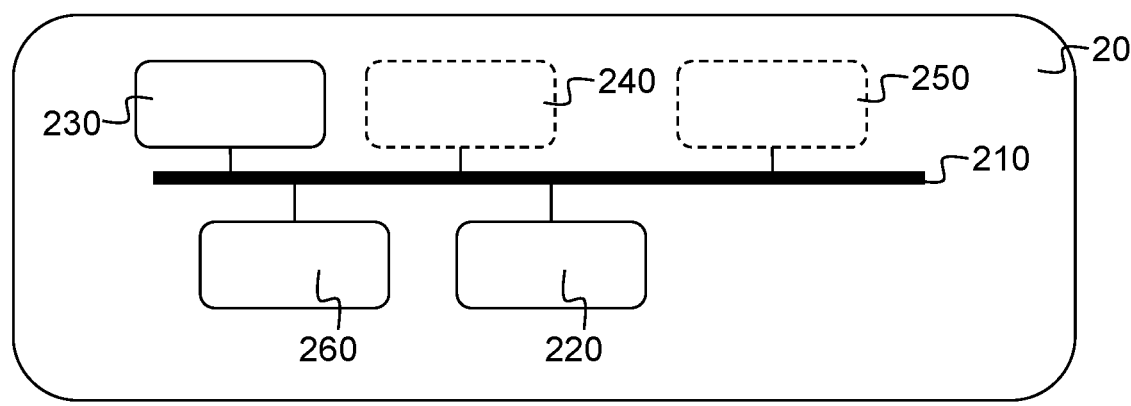
FIG. 4 schematically illustrates a controller node of the distributed object storage system of FIG. 1.

FIG. 4 shows a schematic representation of the controller nodes 20. Controller node 20 may comprise a bus 210, a processor 220, a local memory 230, one or more optional input units 240, one or more optional output units 250, and a communication interface 260. Bus 210 may include one or more conductors that permit communication among the components of controller node 20. Processor 220 may include any type of conventional processor or microprocessor that interprets and executes instructions. Local memory 230 may include a random access memory (RAM) or another type of dynamic storage device that stores information and instructions for execution by processor 220 and/or a read only memory (ROM) or another type of static storage device that stores static information and instructions for use by processor 320 and/or any suitable storage element such as a hard disc or a solid state storage element. An optional input unit 240 may include one or more conventional mechanisms that permit an operator to input information to said controller node 20 such as a keyboard, a mouse, a pen, voice recognition and/or biometric mechanisms, etc. Optional output unit 250 may include one or more conventional mechanisms that output information to the operator, such as a display, a printer, a speaker, etc. Communication interface 260 may include any transceiver-like mechanism that enables controller node 20 to communicate with other devices and/or systems, for example mechanisms for communicating with other storage nodes 30 or controller nodes 20 such as for example two 10 Gb Ethernet interfaces.

The controller node 20 could have an identical design as a storage node 30, or one of the storage nodes 30 of the distributed object storage system could perform both the function of a controller node 20 and a storage node 30. Further, the device on which the application 10 runs may be a controller node 30. In some embodiments, controller node 20 and/or application 10 may include a storage system manager for managing data objects stored in storage system 1. For example, controller node 20 may include a storage system manager configured to define and implement a data center management scheme for storage nodes 30 and their respective storage elements.

Figure 5:
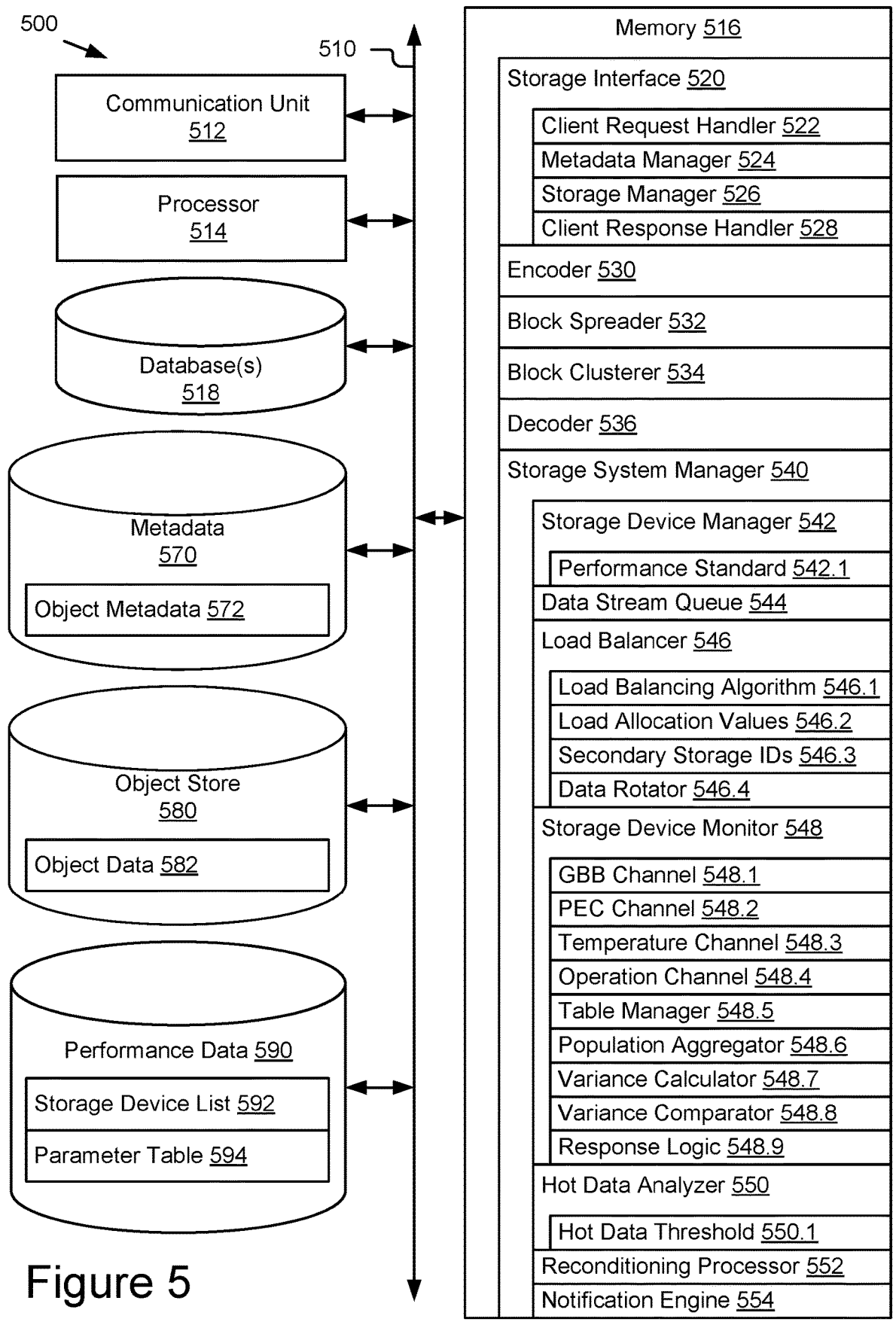
FIG. 5 schematically illustrates some elements of a computing system hosting a storage system manager, such as a controller node.

FIG. 5 schematically shows selected modules of a controller node, storage node, and/or access node with storage management functions for distributed data block storage and access. Object storage system 500 may be configured as a node with an architecture and/or hardware similar to a controller node or storage node. Object storage system 500 may incorporate elements and configurations similar to those shown in FIGS. 1-4. For example, object storage system 500 may be configured in a controller node 20 with object storage management functions and metadata store 570 and/or object store 580 may be embodied in one or more storage nodes 30 in communication with controller node 20.

Object storage system 500 may include a bus 510 interconnecting at least one communication unit 512, at least one processor 514, and at least one memory 516. Bus 510 may include one or more conductors that permit communication among the components of object storage system 500. Communication unit 512 may include any transceiver-like mechanism that enables object storage system 500 to communicate with other devices and/or systems. For example, communication unit 512 may include wired or wireless mechanisms for communicating with file system clients, other access systems, and/or one or more object storage systems or components, such as storage nodes or controller nodes. Processor 514 may include any type of processor or microprocessor that interprets and executes instructions. Memory 516 may include a random access memory (RAM) or another type of dynamic storage device that stores information and instructions for execution by processor 514 and/or a read only memory (ROM) or another type of static storage device that stores static information and instructions for use by processor 514 and/or any suitable storage element such as a hard disc or a solid state storage element.

Object storage system 500 may include or have access to one or more databases and/or specialized data stores, such as metadata store 570, object store 580, and/or performance data 590. Databases may include one or more data structures for storing, retrieving, indexing, searching, filtering, etc. of structured and/or unstructured data elements. In some embodiments, metadata store 570 may be structured as reference data entries and/or data fields indexed by metadata key value entries related to data objects stored in object store 580. Object store 580 may include data objects comprised of object data (such as host data), some amount of metadata (stored as metadata tags), and a GUID. Metadata store 570, object store 580, and/or other databases or data structures may be maintained and managed in separate computing systems, such as storage nodes, with separate communication, processor, memory, and other computing resources and accessed by object storage system 500 through data access protocols. Metadata store 570 and object store 580 may be shared across multiple object storage systems 500.

Object storage system 500 may include a plurality of modules or subsystems that are stored and/or instantiated in memory 516 for execution by processor 514. For example, memory 516 may include a storage interface 520 configured to receive, process, and respond to object data requests from client systems or other nodes in distributed storage system 1. Memory 516 may include an encoder 530 or encoding module configured to disassemble data objects into a plurality of data blocks, such as data shards or symbols for an erasure coding configuration. Memory 516 may include a block spreader 532 or block spreading module configured to distribute the data blocks among a plurality of storage nodes or storage elements according to a spreading policy. Memory 516 may include a block clusterer or clustering module configured to retrieve a subset of distributed data blocks for reassembling the data object. Memory 516 may include a decoder 536 or decoding module configured to reassemble the data object from the retrieved data blocks and the encoding configuration used. Memory 516 may include a storage system manager 540 configured to manage the use of the storage devices in distributed storage system 1 and allocation of data operations received by storage interface 520. In some embodiments, encoder 530, block spreader 532, block clusterer 534, decoder 536, and/or storage system manager 540 may be integrated into storage interface 520 and/or managed as separate libraries or background processes (e.g. daemon) through an API or other interface.

Storage interface 520 may include an interface protocol or set of functions and parameters for storing, reading, and otherwise managing data requests to an associated distributed storage system and the corresponding metadata data source for mapping file data to persistent storage data elements. For example, storage interface 520 may include functions for reading, writing, modifying, or otherwise manipulating data objects and their respective client or host data and metadata in accordance with the protocols of an object storage system.

In some embodiments, storage interface 520 may include a plurality of hardware and/or software modules configured to use processor 514 and memory 516 to handle or manage defined operations of storage interface 520. For example, storage interface 520 may include a client request handler 522, a metadata manager 524, a storage manager 526, and a client response handler 528. For any given client request, storage interface 520 may receive a client request through client request handler 522 and determine one or more operations based on the content of the request. These operations may include metadata operations handled by metadata manager 524 and/or object data operations handled by storage manager 526. The results of these operations may be processed, formatted, and returned by client response handler 528.

Client request handler 522 may include an interface and/or communication event-based condition for receiving object data requests from one or more clients. For example, client systems may send an object data request over a network connection and addressed to object storage system 500 or a port or component thereof. Client request handler 522 may receive these requests and parse them according to the appropriate communication and object storage protocols. For example, client request handler 522 may identify a transaction identifier, a client identifier, an object identifier (object name or GUID), a data operation, and additional parameters for the data operation, if any, from the received message or messages that make up the object data request. In some embodiments, client request handler 522 may combine requests from a plurality of clients to the plurality of storage elements in storage system 1 in a common data stream. For example, the common data stream may be embodied in a common data stream queue, such as data stream queue 544, as a series of data operations targeting data objects stored in object store 580.

Metadata manager 524 may include interfaces, functions, and/or parameters for creating, modifying, deleting, accessing, and/or otherwise managing object metadata, such as object metadata 572 stored in metadata store 570. For example, when a new object is written to object store 580, at least one new metadata entry may be created in metadata store 570 to represent parameters describing or related to the newly created object. Metadata manager 524 may generate and maintain an object data index that enables metadata manager 524 to locate object metadata within metadata store 570. For example, metadata store 570 may be organized as a key-value store and object data index may include key values for data objects and/or operations related to those objects that are indexed with a key value that include the object identifier or GUID for each object. In some embodiments, metadata manager 524 may also manage object metadata stored in object store 580 with object data 582. Metadata manager 524 may work in conjunction with storage manager 526 to create, modify, delete, access or otherwise manage object metadata stored as object tags within object store 580.

Storage manager 526 may include interfaces, functions, and/or parameters for reading, writing, and deleting object data elements in object store 580. For example, object PUT commands may be configured to write object identifiers, object data 582, and/or object tags to object store 580. Object GET commands may be configured to read data from object store 580. Object DELETE commands may be configured to delete data from object store 580, or at least mark a data object for deletion until a future garbage collection or similar operation actually deletes the data or reallocates the physical storage location to another purpose.

Other object storage commands may be handled by storage manager 526. Object storage commands processed by storage manager 526 may include parameters for accessing special functions and/or metadata resources stored with host or client data in the data objects. Storage manager 526 may work in conjunction with metadata manager 524 for managing object metadata, including versioning information. Storage manager 526 may operate in conjunction with encoder 530, block spreader 532, block clusterer 534, and decoder 536 for encoding and decoding data objects in redundant and distributed data blocks in accordance with an erasure coding configuration or other data redundancy method. For example, storage manager 526 may use encoder 530 and block spreader 532 to write data to object store 580 and use block clusterer 534 and decoder 536 to read data from object store 580. Encoder 530, block spreader 532, block clusterer 534, and decoder 536 may in turn use load balancer 546 to select which storage elements within a given set of storage elements should be used for such write and/or read operations.

Client response handler 528 may include an interface and/or communication logic for sending response messages, such as result, status, or error messages, to one or more clients related to object data requests received. For example, client response handler 528 may wait for processing by metadata manager 524 and/or storage manager 526 to complete or generate an error, and then provide an appropriate result or error message to the client system(s) for each object data request received In some embodiments, metadata store 570 may be distributed across multiple systems, such as a plurality of access systems. Metadata store 570 and/or portions thereof may be sharded data stores, wherein the data stores are partitioned into segments stored in different computing systems. Storage interface 520 may include the functions for locating and accessing relevant portions of the sharded data base.

Encoder 530, block spreader 532, block clusterer 534, and decoder 536 may comprise an erasure coding engine configured to store data objects in accordance with a reliability policy which guarantees a level of redundancy. This reliability policy may be defined and managed by storage system manager 540 and may include encoding schemes, redundancy policy, and spreading policy. Encoder 530, block spreader 532, block clusterer 534, and decoder 536 may individually or collectively include an interface protocol or set of functions and parameters for distributing data blocks corresponding to data objects across designated sets of storage nodes and storage elements and reassembling those data objects from subsets of those sets (allowing for failures, errors, interruptions, and optimizations). For example, object storage system 500 may correctly retrieve a data object distributed among storage elements even if a number of those storage elements have failed or are otherwise inaccessible. Encoder 530, block spreader 532, block clusterer 534, and decoder 536 may implement an erasure coding configuration to achieve the requirements of a reliability policy with less overhead than full redundancy. For example, encoder 530, block spreader 532, block clusterer 534, and decoder 536 may implement Reed-Solomon codes, fountain codes, or rateless erasure codes such as online codes, low-density parity-check (LDPC) codes, raptor codes, and numerous other coding schemes that are available.

Encoder 530 may receive a data object from storage manager 526 and disassemble the data object into a predetermined number of redundant sub blocks, all associated with the same data object identifier and comprising an object set of data blocks. The predetermined number of data blocks may correspond to a predetermined multiple of a desired spreading width, based on the sum of a minimal spreading requirement and a maximum number of concurrent failures. The maximum concurrent failures tolerance may correspond to the number of storage elements that store data blocks for the data object and are allowed to fail concurrently as determined by the reliability policy. The minimum spreading requirement may correspond to the minimum number of storage elements that must be available to reassemble the data object. Encoder 530 may use an erasure coding configuration to produce the predetermined number of data blocks. In some embodiments, each data block may comprise encoded data of equal size, such as the total data object size divided by a factor equal to a predetermined multiple of the spreading requirement. Some or all data blocks may also include decoding data, such as parity data or other decoding data.

Block spreader 532 may store the predetermined number of redundant data blocks on a number of storage elements which corresponds to the desired spreading width or more. For example, block spreader 532 may store on each storage element a predetermined multiple of data blocks such that the data blocks are evenly distributed among the storage elements. In some embodiments, these storage elements may be split across module storage nodes or even multiple storage racks, storage sites, or other layers of a hierarchical storage architecture, but they may still comprise a common storage pool within object store 580.

Block spreader 532 may implement a spreading policy that may include, for example, a number of storage elements to receive the blocks, the storage pool from which those storage elements may be selected, and constraints or algorithms for how they are to be distributed (e.g. evenly across elements or nodes, randomly within an acceptable range, or using some other distribution method). In some embodiments, a load balancing algorithm, such as load balancing algorithm 546.1 in load balancer 546, may be used to determine which storage elements receive the blocks to be stored. For example, the load balancing algorithm may rotate through the available storage devices for receiving data blocks based on load allocation values that may vary based on previous data operations and/or degrading performance of selected storage devices. In some embodiments, block spreader 532 may invoke load balancer 546 to select specific storage devices within a storage pool to receive one or more data blocks as further described below.

Block clusterer 534 may receive a request from storage manager 526 to retrieve a selected data object that has previously been stored through encoder 530 and block spreader 532. Based on the data object identifier, block clusterer 534 may locate a predetermined number of the redundant data blocks that were stored in the storage elements. Block clusterer 534 does not need to be able to retrieve all of the encoded data blocks in order to reassemble the data block, only a subset equal to the minimal spreading requirement. While the likelihood of outright failures corresponding to the failure tolerance is extremely low, there may be service interruptions, delays, resource bottlenecks (processing, memory, bandwidth, etc.), and other considerations that make some storage elements easier or less costly to access. Block clusterer 534 may invoke load balancer 546 to select specific storage elements among the set of storage elements storing the data blocks corresponding to the selected data object. For example, load balancer 546 may determine a subset of storage devices or a prioritized list for enabling block clusterer 534 to choose the storage devices from which to retrieve the subset of data blocks while attempting to balance the input/output (I/O) operations being handled by each storage device.

Decoder 536 may reassemble the selected data object from the subset of data blocks retrieved by block clusterer 534. For example, decoder 536 may apply a decoding algorithm and the decoding data from the data blocks to the encoded data in the data blocks to reassemble the selected data object from the subset of data blocks. The resulting data object may be returned to storage manager 526 and storage interface 520 to respond to a host request or other storage operation.

Storage system manager 540 may include an interface protocol or set of functions and parameters for receiving, defining, and otherwise managing storage schemes for object storage system 500 and/or a broader distributed storage system. For example, storage system manager 540 may include functions for initiating, storing, modifying, or otherwise manipulating one or more storage schemes for one or more data centers, including load balancing schemes for managing a set of storage devices. In some embodiments, storage system manager 540 may include one or more functions that enforce storage policies for the storage schemes, such as a load balancer used by block spreader 532 and block clusterer 534 to select specific storage devices for storage operations. Storage system manager 540 may also include higher-level storage management functions for initiating tiering, migration, reconditioning, and similar data management responsive to storage device performance. In some embodiments, storage system manager 540 may include or interface with a graphical user interface for enabling system administrators to view, modify, and otherwise manage storage scheme parameters and configurations.

In some embodiments, storage system manager 540 may include a plurality of hardware and/or software modules configured to use processor 514 and memory 516 to handle or manage defined operations of storage system manager 540. For example, storage system manager 540 may include a storage device manager 542, data stream queue 544, load balancer 546, storage device monitor 548, hot data analyzer 550, reconditioning processor 552, and notification engine 554. For example, storage device manager 542 may identify the storage devices in the storage pool supporting object store 580, data stream queue 544 may receive and organize the data operations in the common data stream received by client request handler 522, load balancer 546 may select the storage devices to use for any storage operation, storage device monitor 548 may receive and identify variances in performance parameters for the storage devices, hot data analyzer 550 may detect variances in data block usage, reconditioning processor 552 may initiate a reconditioning process for storage devices exhibiting certain variance conditions, and notification engine 554 may enable notifications to other systems or components in response to variances detected by storage device manager 548. Collectively, storage device manager 542, data stream queue 544, load balancer 546, storage device monitor 548, hot data analyzer 550, reconditioning processor 552, and notification engine 554 may define a dynamic storage system load balancing scheme for managing data operations to a set of storage devices attempting to maintain a common performance standard.

Storage device manager 542 may include data structures, functions, and interfaces for identifying one or more sets of storage devices, such as the storage devices that make up object store 580 and/or one or more storage nodes or storage servers thereof. For example, a storage pool supporting object store 580 may include a large number of storage devices grouped into storage nodes. The storage nodes may be arranged in racks or clusters using common power and networking resources, racks and clusters may be distributed across sites or data centers, from different server rooms and buildings, to geographically dispersed data centers. In some embodiments, storage device manager 542 may manage a storage device list 592. For example, storage device manager 542 may create, store, modify, and/or delete storage device entries in storage device list 592 that may include unique storage device identifiers, storage device types (class, manufacturer, model, interface, etc.), storage device parameters (capacity, input/output operations per second (TOPS), etc.), hierarchical address, configuration parameters, etc. In some embodiments, storage device manager 542 may include one or more performance standards 542.1 for one or more sets of storage devices in storage device list 592. For example, groups of storage devices in the same storage node, storage rack, data center, or distributed storage system may be expected to maintain a consistent TOPS, for example X megabytes per second (MB/s), for each storage device to provide an aggregate performance of M*X MB/s, where M is the number of storage devices in a given set of storage devices, such as M storage devices in a storage node, storage server, etc.

Data stream queue 544 may include interfaces, functions, and/or parameters for receiving and organizing data operations from client request handler 522 and/or other sources for a common data stream to and from the storage devices of object store 580. For example, data stream queue 544 may include all validated data operations received or generated by object storage system 500 in a queue for processing by storage manager 526 and/or metadata manager 524. Data stream queue 544 may assure that all data operations may be processed in conjunction with load balancer 546 and enable load balancer 546 to properly allocate data operations to storage devices. In some embodiments, data stream queue 544 may include one or more operational queues, generally organized in a first-in-first-out (FIFO) order and subject to prioritization and batching, depending on the queuing configuration.

Load balancer 546 may include interfaces, functions, and/or parameters for selecting which storage devices will be used for any given data operation, such as storing data blocks for objects or files being stored. For example, load balancer 546 may use data stream queue 544 and/or prior allocation of data operations to determine the next storage device or set of storage devices to process one or more data operations. In some embodiments, load balancer 546 may track allocation of storage operations across the storage devices in a storage pool in an attempt to distribute data operations as evenly as possible to achieve both short-term I/O balance and longer-term storage capacity and P/E cycles. For example, the base configuration of load balancer 546 may assume that all storage devices of a selected type and capacity (according to storage device manager 542) may operate essentially identically and that even allocation of data operations may result in the most consistent lifetime performance from those storage devices. In some embodiments, load balancer 546 may be configured to operate in conjunction with storage device monitor 548 in order to compensate for actual variations in storage device performance based on performance parameters collected in real-time from and/or about those storage devices. For example, load balancer 546 may inject weighting factors into the selection of storage devices that reduces the frequency of using degrading storage devices and/or relegates them to secondary storage roles based on the variance of their performance from the normative values (such as a mean value) of the aggregate performance of the storage pool.

In some embodiments, load balancer 546 may use load balancing algorithm 546.1 load allocation values 546.2 to determine the selection of storage devices for storage operations. Load balancing algorithm 546.1 may include one or more logical evaluations or calculations to distribute data operations among the population of storage devices. For example, load balancing algorithm 546.1 may include a randomizer, round-robin selector, or more complex logic for distributing data operations evenly among the storage devices. In some embodiments, load balancing algorithms 546.1 may include logic or factors that compensate for variations in data stream queue 544, such as objects of varying size, operations of varying resource intensity (such as buffer, compute, parity, etc.), etc. Load allocation values 546.2 may provide an additional factor for the selection of storage devices based on weighting individual storage devices based on their health. For example, each storage device may start with a nominal load allocation value of 1, representing a healthy storage device, and receipt of 1 unit of load allocation in each round of load allocation. As a storage device degrades, its load allocation may decrease such that it only receives 0.8 (80%), 0.5 (50%), 0.1 (10%), etc. load allocation. So, in a round-robin load balancing algorithm, a storage device with a 0.5 load allocation value may only receive a data operation every other round through the set of storage devices.

In some embodiments, load balancer 546 may include additional logic for managing degrading storage devices. For example, load balancer 546 may be configured to dynamically manage tiered storage based on degrading storage device status. For example, load balancer 546 may maintain a set of secondary storage identifiers (IDs) 546.3 for storage devices that have degraded to a point that they should no longer be relied on for primary storage. In some embodiments, storage devices with storage device identifiers in secondary storage identifiers 546.3 may no longer receive primary (host) storage operations and act only has mirror, backup, or archival storage resources. For example, when the load allocation values 546.2 drop below a threshold value (e.g., 0.5) or another trigger condition identifies a storage device for secondary storage, the degrading storage device may be added to secondary storage IDs 546.3 and removed from the pool available to load balancer 546 for active data operations (though still used for background operations, like replication for backup or archive).

In some embodiments, load balancer 546 may include a data rotator 546.4 that may be invoked to migrate data among the pool of storage devices for load balancing reasons. For example, data rotator 546.4 may read data blocks stored to one or more storage devices and rotate them to other storage devices using load balancing algorithm 546.1. For example, when the load allocation values 546.2 drop below a threshold value (e.g., 0.5) or another trigger condition identifies a storage device for data rotation, data rotator 546.4 may identify and read active data blocks and/or hot data blocks on the degrading storage device, read those data blocks, and redistribute them through load balancer 546 (which may result in the data blocks being distributed differently based on changed load allocation values and/or secondary storage IDs 546.3). In some embodiments, data rotator 546.4 may be invoked in response to hot data analyzer 550 to redistribute data elements with unusually high access, regardless of whether the hot data is stored on degrading storage devices.

Storage device monitor 548 may include interfaces, functions, and/or parameters for monitoring a variety of performance parameters for a set of storage devices and using variance calculations to determine operating responses. For example, storage device monitor 548 may receive self-monitoring, analysis, and reporting technology (SMART) data from each of the storage devices in the storage pool identified in storage device manager 540 and use grown bad block (GBB) data, program erase cycle (PEC) data, storage device temperature data, and/or operational log/count data to calculate variances among the drives for each data type and evaluate response logic for responding to degrading storage devices. In some embodiments, storage device monitor 548 may be configured to receive, store, calculate variance, and respond to degrading performance at a more granular level than storage devices. For example, storage device monitor 548 may receive performance parameters for individual dies or other physical subunits of each storage device and manage those storage media across the population of storage devices by variance.

In some embodiments, storage device monitor 548 may include a plurality of data channels configured to receive, store, and/or retrieve performance data. For example, storage device monitor 548 may receive various types of performance data from SMART data feeds, parameter logs, and/or other data sources generated by the storage devices and store the relevant data values, such as a most recent value, aggregate value, time-averaged value, etc., in performance data store 590. In some embodiments, storage device monitor 548 may include a GBB channel 548.1, a PEC channel 548.2, a temperature channel 548.3, and an operations channel 548.4. For example, a SMART data feed from each storage device may include the most recent GBB, PEC, temperature, and TOPS values. In some embodiments, storage device monitor 548 may receive any number of additional performance parameters, such as an overprovisioning value for remaining overprovisioning storage space in the storage device, or other performance parameters. These additional parameters may have their own defined data channels, based on where those values are generated and stored and whether they are included in the SMART data feed or another source.

In some embodiments, storage device monitor 548 may be configured to store parameter values in a performance parameter table, such as parameter table 594 is performance data 590. For example, each time updated data values are received through one or more channels for a storage device, those updated data values may be added to an entry for the storage device in parameter table 594. An example configuration of parameter table 594 is further described below with regard to FIG. 6. Storage device monitor 548 may include a table manager 548.5 that includes logic for parsing performance values received through GBB channel 548.1, PEC channel 548.2, temperature channel 548.3, and/or operations channel 548.4 and updating appropriate entries in parameter table 594. For example, table manager 548.5 may validate performance data values and store them according to the parameter type and storage device identifier by overwriting the prior entry for that parameter type and storage device identifier.

In some embodiments, storage device monitor 548 may be configured to use variance calculations to alter or modify the operation of other subsystems in response to variances that indicate a degrading storage device that has parameters changing more rapidly than the set of similar storage devices in its storage pool. For example, a population aggregator 548.6 may aggregate a parameter type across storage devices to provide a baseline value from which the variance of each storage device may be calculated. A variance calculator 548.7 may calculate a variance from the baseline value for each storage device and a variance comparator 548.8 may evaluate the variance against various thresholds for responding to changes in the performance of the storage devices. Response logic 548.9 may include logical rules associated with the various parameter types and threshold values to determine automatically generated response actions, such as adjusting load allocation values 546.2, adding a degrading storage device to secondary storage IDs 546.3, and/or initiating data rotator 546.4, reconditioning processor 552, and/or notification engine 554.

In some embodiments, variance calculation for each performance parameter type may be determined independently and associated response thresholds and actions may independently determine degrading storage device status and a specific response based on the type of degradation identified by the performance parameter type and threshold. For example, GBB values for the set of storage devices may be aggregated by population aggregator 548.6 to generate an average GBB value for the set of storage devices as a baseline. Variance values may be generated by variance calculator 548.7 for each storage device by comparing each storage device's GBB value to the average GBB value. One or more GBB variance threshold values may be defined and the variance value of each storage device may be compared by variance comparator 548.8 to determine degrading storage devices based on GBB outliers. For example, a GBB variance threshold value may be set at 1.2 (or 20% higher than baseline) and storage devices with GBB variance values of 1.2 may qualify as a degrading storage device and generate a response that modifies the load allocation value for that storage device to decrease the allocation of data operations, such a by an inverse of the variance value. A second GBB variance threshold may be set, such as a GBB variance value of 2 (100% higher than baseline) and trigger addition of the storage device to secondary storage. In some embodiments, response logic 548.9 may include comparisons based on additional variables (such as performance parameters, variance values, or other derived values) Further examples of operation of variance comparisons and response logic may be provided below with regard to FIGS. 8-11.

Hot data analyzer 550 may include interfaces, functions, and/or parameters for determining data blocks or logical addresses that have a high level of data operations. For example, hot data analyzer 550 may monitor the data stream in and out of each of the storage devices to determine when the I/O data operations to any given storage device exceed the others by a significant margin. In some embodiments, hot data analyzer 550 may operate in conjunction with storage device monitor 548 to monitor an TOPS value for each storage device. For example, storage device monitor 548 may receive and store TOPS values from operations channel 548.4 and use variance calculator 548.7 and variance comparator 548.8 to determine when one or more storage devices are getting out of balance with other storage devices.

If the TOPS variance of a storage device meets or exceeds a hot data threshold 550.1, the data blocks stored and accessed on the storage device may be identified as hot data blocks. In some embodiments, hot data analyzer 550 may be configured to specifically determine which data blocks stored on a storage device with the TOPS variance are responsible for the elevated TOPS. For example, TOPS to each data block, set of data blocks, storage media subunit, etc. may be used to calculate variances and more specifically identify the hot data blocks.

In some embodiments, hot data analyzer 550 may initiate data rotator 546.4 to rotate the hot data blocks across the pool of storage devices. For example, cross storage device data rotation may enable load balancer 546 to distribute the hot data blocks across the storage devices using load balancing algorithm 546.1. In some embodiments, hot data analyzer 550 may include logic for determining responses for one or more hot data threshold values and/or response logic 548.9 may include logic rules for TOPS variance that provide hot data response. In some embodiments, response to hot data blocks may include both real-time allocation of new data operations for hot data blocks in accordance with load balancer 546, including load allocation values 546.2 and/or secondary storage IDs 546.3 to exclude use of degrading storage devices, and use of data rotator 546.4 to proactively rotate previously stored hot data blocks across storage devices. Data rotator 546.4 may read the identified hot data blocks from their current storage devices and redistribute them through write operations selecting other storage devices using load balancing algorithm 546.1.

Reconditioning processor 552 may include interfaces, functions, and/or parameters for initiating a reconditioning process for a target storage device. For example, reconditioning processor 552 may be initiated by response logic 548.9 when a variance value, such as a PEC variance value, for a storage device meets or exceeds a reconditioning threshold value. In some embodiments, reconditioning processor 552 may initiate a maintenance operation to re-write all data blocks in the storage device to recondition the storage device. For example, the reconditioning process may include reading all active data blocks from the storage device, writing them to one or more other storage devices, erasing all media locations where data blocks were stored or otherwise systematically erasing and resetting the storage media, and, optionally, rewriting the moved data blocks back to the storage device. Reconditioning processor 552 may be configured to remove obsolete or trimmed data during the writing and/or rewriting process, which may reduce the amount of data traffic for the operation and/or subsequent operations. In some embodiments, the data blocks may be moved through write operations using load balancer 546 and distributed across the other storage devices (and may not be rewritten back to the device). In some embodiments, the data blocks may be moved through write operations to storage devices in secondary storage IDs 546.3 to provide temporary backup before being written back to the reconditioned storage device.

Notification engine 554 may include interfaces functions, and/or parameters for initiating notification messages or similar indicators to other subsystems and/or system administrators to initiate further action. For example, notification engine 554 may generate notification messages to other subsystems to initiate an environmental control responses, such as activating or adjusting fan units, fluid cooling systems, or similar controls for cooling specific storage devices or locations including such storage units (racks, enclosures, rooms, etc.). In some embodiments, an environmental change notification may be sent to an environmental control system that manages one or more cooling systems and the environmental change notification may trigger automatic response logic within the environmental control system to change cooling system parameters, such as turning specific fans on, increasing their speed, or directing coolant to a particular housing or thermal interface. Notification engine 554 may be used for communication with other automated response systems, including other storage system management subsystems, based on trigger conditions in response logic 548.9 and messaging protocols available to notification engine 554. In some embodiments, notification engine 554 may also be configured to generate user alerts to system administrators in order to initiate manual responses. For example, a notification of a degrading storage device may add that storage device to a maintenance list for relocation or replacement and provide an appropriate visual or audible cue to a responsible administrator or technician.

Memory 516 may include additional logic and other resources (not shown) for processing object data requests, such as modules for generating, queueing, and otherwise managing object data requests. Processing of an object data request by storage interface 520 may include any number of intermediate steps that yield at least one data request to the distributed storage system.

Figures 6, 7:
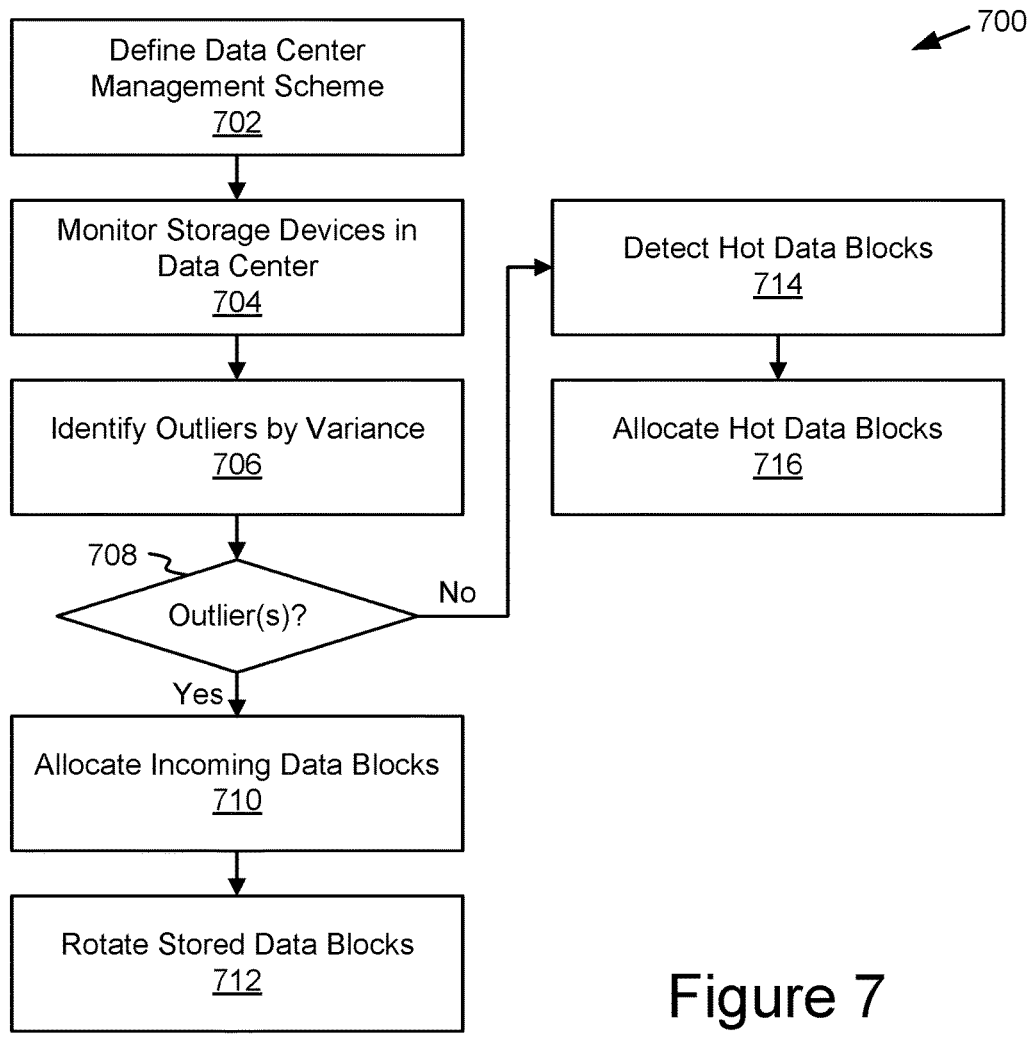
FIG. 6 schematically illustrates an example parameter table for managing a population of storage devices.
FIG. 7 is a flowchart of an example method of managing data block allocation based on variance among storage devices.

FIG. 6 shows an example parameter table 600 for managing a population of storage devices of a distributed storage system, similar to distributed storage system 1 and its components, as described in FIGS. 1-5. Parameter table 600 may be stored in memory in a database, file, or similar data structure. Parameter table 600 may include a plurality of value entries 614 corresponding to specific device identifiers 610 and associated parameters 620. Parameter table 600 may also include calculated variances 630 for the storage devices and/or allocation values 640. In some embodiments, parameters 620, variances 630, and/or allocation values 640 may be stored in separate parameter tables or similar data structures.

In the configuration shown, parameter table 600 includes a plurality of columns that correspond to storage device identifiers 610.1-610.*n* and define a set of parameter entries for each storage device. Parameter table 600 may also include one or more aggregate values based on the entries for a parameter type across the population of storage devices. For example, aggregate values 612 may include entries for the sum, mean, median, mode, and/or other relevant values derived from the row of parameter values for each storage device.

In the configuration shown, parameter table 600 includes a plurality of rows that correspond to parameter types, variance types, and allocation values for each storage device. Parameters 620 may include GBB values 622, PEC values 624, temperature values 626, and I/O operations values 628. For example, these entries may include the performance parameter values received from each of the storage devices. Variances 630 may include GBB variance values 632, PEC variance values 634, temperature variance values 636, and I/O operations variance values 638. For example, these entries may include the variance values calculated by storage device monitor 548. Allocation values 640 may include load allocation values 546.2 as initially set for equal distribution of data operations among the storage devices and/or as modified by storage device monitor 548 in response to degrading storage devices. In some embodiments, allocation values 640 may include allocation value modifiers based on variances 630 to be applied to load allocation values 546.2.

As shown in FIG. 7, storage system 500 may be operated according to an example method of managing data block allocation based on variance among storage devices, i.e. according to method 700 illustrated by blocks 702-716 in FIG. 7.

At block 702, a data center management scheme may be defined. For example, a storage system manager may determine one or more storage pools containing sets of storage devices with similar performance specifications that are configured to provide a consistent service level for one or more applications.

At block 704, the storage devices in the data center may be monitored. For example, a storage device monitor may periodically receive performance parameters from each of the storage devices in the storage pool.

At block 706, storage devices with outlier performance values may be identified by variance calculations. For example, the storage device monitor may calculate an aggregate baseline value from the performance values for all storage devices, determine the variance from the baseline value for each of the storage devices, and identify any storage devices with high variances relative to the other storage devices.

At block 708, whether there are actionable outliers may be determined. For example, the storage device monitor may compare the outlier variance values to one or more response thresholds for each performance parameter. If a response threshold is met, then the storage device has been identified as a degrading outlier and method 700 may continue to block 710. If the response threshold is not met, then no actionable outliers are identified and method 700 may proceed to block 714 to balance any hot data blocks among the storage devices.

At block 710, incoming data blocks may be allocated differently based on the identified outlier(s). For example, a load balancer may weight the allocation of data blocks in storage operations to allocate data blocks to outlier storage devices with degrading performance with a lower frequency.

At block 712, data blocks previously stored to the outlier storage device(s) may be rotated. For example, the load balancer may initiate a data rotation among the storage devices by reading data blocks from the outlier storage device and re-storing them using the weighted load balancing allocation so that less data blocks are allocated to the outlier storage device.

At block 714, hot data blocks may be detected in the common data stream directed to the storage devices. For example, a hot data analyzer may receive I/O parameter values for the storage devices and calculate variances to detect data blocks with operations meeting or exceeding a hot data threshold.

At block 716, hot data blocks may be allocated among the storage devices to balance the hot data blocks across storage devices. For example, the hot data analyzer may initiate a data block rotation for the hot data blocks to enable the load balancer to redistribute the hot data blocks across the storage devices.

Figure 8:
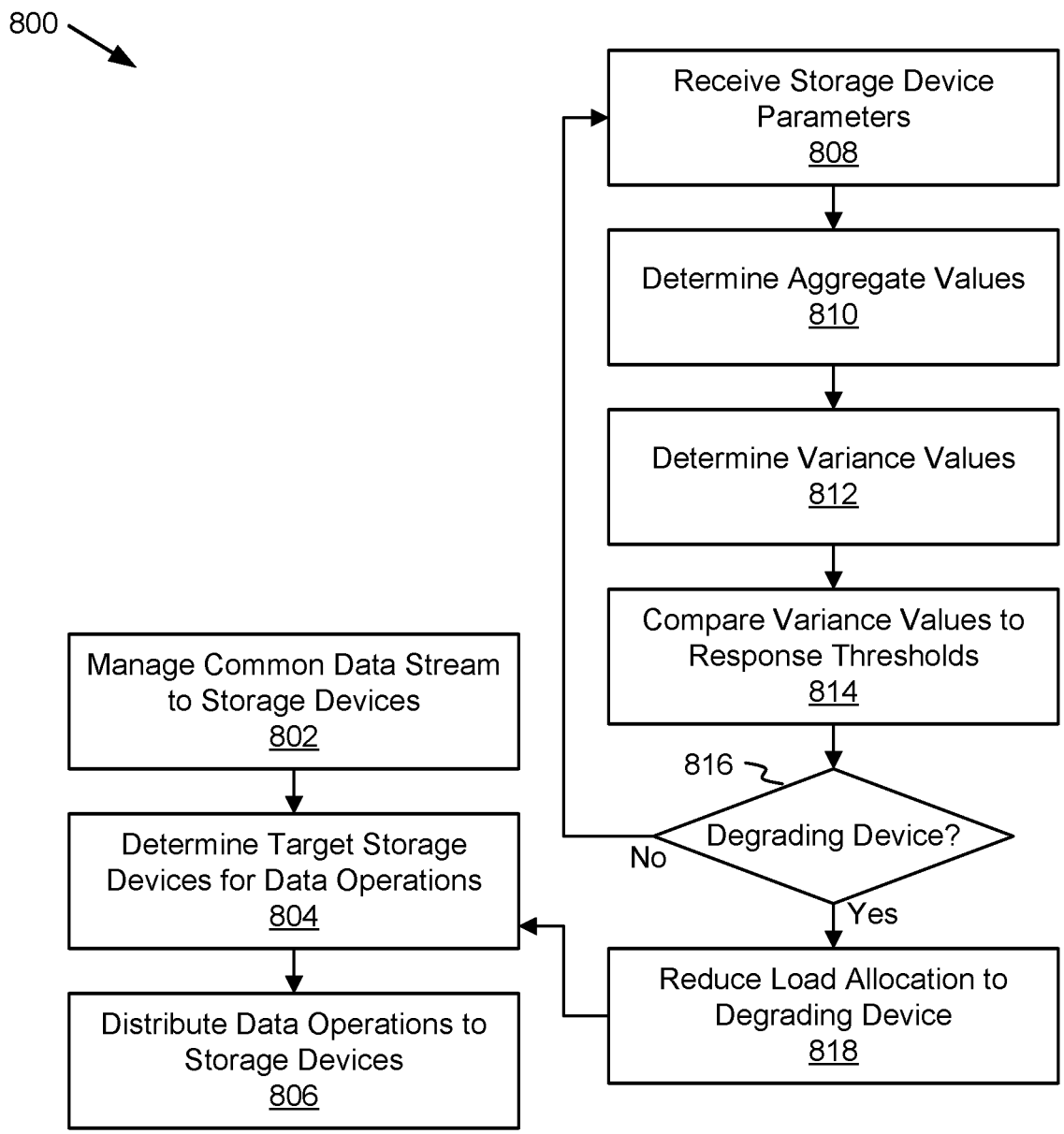
FIG. 8 is a flowchart of an example method of load balancing based on variance among storage devices.

As shown in FIG. 8, storage system 500 may be operated according to an example method of load balancing based on variance among storage devices, i.e. according to method 800 illustrated by blocks 802-818 in FIG. 8.

At block 802, a common data stream to a set of storage devices may be managed. For example, a storage system manager may receive all data operations directed to the set of storage devices identified by a storage device manager and manage them through a common data stream queue in order to control allocation of data operations to each of the storage devices.

At block 804, target storage devices may be determined for each data operation directed to the set of storage devices. For example, a load balancer may use a load balancing algorithm to determine the target storage device for each data operation, particularly selecting different storage devices for storing new data blocks to evenly utilize storage resources.

At block 806, the data operations may be distributed to the storage devices based on the target storage devices determined at block 804. For example, a storage manager may send each data operation to the respective target storage device for processing of the data operation using the processing and storage media resources of the target storage device.

In parallel with the load balancing operations of blocks 802-806, performance variations among the storage devices may be detected and used to modify the load balancing operations. At block 808, storage device parameters may be received from the storage devices. For example, a storage device monitor may receive SMART data including GBB, PEC, temperature, and/or IOPS data values from each storage device.

At block 810, aggregate values for each type of performance parameter may be determined. For example, a population aggregator may process a series of parameter values of the same type for each of the storage devices, such as a row of parameter values in a parameter table, to calculate an aggregate baseline value for the set of storage devices.

At block 812, variance values for each storage device may be determined for the performance parameter. For example, a variance calculator may process the parameter value for each storage device and the aggregate baseline value to determine a variance value for that storage device and performance parameter.

At block 814, variance values may be compared to response thresholds to identify degrading devices and/or other responses. For example, a variance comparator may compare the variance values calculated for each storage device and each performance parameter against a corresponding response threshold that defines a degrading storage device based on performance relative to the other storage devices in the set of storage devices.

At block 816, whether there are degrading storage devices among the set of storage devices may be determined. If a response threshold is met, then the storage device has been identified as a degrading storage device and method 800 may continue to block 818 to modify the load balancing process. If the response threshold is not met, then no degrading storage devices are identified and method 800 may return to block 808 to continue monitoring storage devices for performance variances that identify degrading storage devices.

At block 818, load allocation to the degrading storage device(s) may be reduced. For example, response logic based on the response threshold met may modify the load allocation values for the degrading storage device relative to the other storage devices to configured the load balancer to reduce the frequency with which data operations are directed to the degrading storage device. These modified load allocation values may be used at block 804 to determine the target storage devices of data operations going forward.

As shown in FIG. 9, storage system 500 may be operated according to an example method of using grown bad blocks to manage degrading storage devices, i.e. according to method 900 illustrated by blocks 902-910 in FIG. 9.

At block 902, grown bad block (GBB) values may be received from the storage devices. For example, a storage device monitor may receive GBB values from each storage device.

At block 904, GBB variance values for each storage device may be determined. For example, a variance calculator may process the GBB parameter value for each storage device and the aggregate baseline value for GBB across the set of storage devices to determine a GBB variance value for that storage device.

At block 906, the GBB variance values may be compared to response thresholds to identify degrading devices and/or other responses. For example, a variance comparator may compare the GBB variance values calculated for each storage device against one or more corresponding response thresholds that defines degrading storage devices and response logic for responding to the GBB performance variance.

At block 908, whether there are degrading storage devices among the set of storage devices based on GBB performance variance may be determined. If a GBB response threshold is met, then the storage device has been identified as a degrading storage device and method 900 may continue to block 910 to respond to the GBB-based degradation. If the response threshold is not met, then the storage devices have not reached the response threshold for block 910 and method 900 may return to block 902 to continue monitoring storage devices for GBB performance variances that identify degrading storage devices.

At block 910, an overprovisioning value may be received for the degrading storage device(s). For example, the storage device monitor may receive current overprovisioning values that reflect the remaining overprovisioned space in each storage devices through a data channel similar to the data channel for receiving updated GBB values. In some embodiments, the degrading storage device(s) may trigger reduced load allocations per method 800 while continuing to monitor for additional response thresholds, such as an overprovisioning response threshold. For example, the first response threshold may trigger a change in allocations and set a flag for checking other parameters, such as overprovisioning, going forward.

At block 912, the overprovisioning value may be compared to an overprovisioning response threshold. For example, the storage device monitor may compare the overprovisioning value or an overprovisioning variance value based on the overprovisioning value to a response threshold value based on identifying critically low overprovisioned space. In some embodiments, the overprovisioning response threshold may be an absolute value of required overprovisioned space to continue operation as a primary storage device and the overprovisioning value may be the amount of remaining overprovisioning space in the storage device.

At block 914, whether the overprovisioning is lower than the overprovisioning response threshold may be determined. If the overprovisioning response threshold is met, then the storage device has low overprovisioning and method 900 may continue to block 916 to respond to the low overprovisioning. If the overprovisioning response threshold is not met, then the storage device still has adequate overprovisioning space and has not met the response threshold for block 916 and method 900 may return to block 902 to continue monitoring storage devices for the combination of GBB performance variances and low overprovisioning.

At block 916, the degrading storage device(s) may be allocated to secondary storage. For example, response logic based on the GBB response threshold met may add the degrading storage device to a list of secondary storage identifiers that remove the degrading storage device from primary storage for new data operations. In some embodiments, the GBB response threshold for secondary storage may be a second and higher GBB response threshold that operates in addition to one or more lower GBB thresholds for reducing load allocation to degrading storage devices in accordance with method 800.

As shown in FIG. 10, storage system 500 may be operated according to an example method of using program erase cycles to manage degrading storage devices, i.e. according to method 1000 illustrated by blocks 1002-1010 in FIG. 10.

At block 1002, program erase cycle (PEC) values may be received from the storage devices. For example, a storage device monitor may receive PEC values from each storage device.

At block 1004, PEC variance values for each storage device may be determined. For example, a variance calculator may process the PEC parameter value for each storage device and the aggregate baseline value for PEC across the set of storage devices to determine a PEC variance value for that storage device.

At block 1006, the PEC variance values may be compared to response thresholds to identify degrading devices and/or other responses. For example, a variance comparator may compare the PEC variance values calculated for each storage device against one or more corresponding response thresholds that defines degrading storage devices and response logic for responding to the PEC performance variance.

At block 1008, whether there are degrading storage devices among the set of storage devices based on PEC performance variance may be determined. If a PEC response threshold is met, then the storage device has been identified as a degrading storage device and method 1000 may continue to block 1010 to respond to the PEC-based degradation. If the response threshold is not met, then the storage devices have not reached the response threshold for block 1010 and method 1000 may return to block 1002 to continue monitoring storage devices for PEC performance variances that identify degrading storage devices.

At block 1010, a reconditioning process for the degrading storage device(s) may be initiated. For example, response logic based on the PEC response threshold met may initiate a reconditioning processor targeting the degrading storage device to systematically recondition the storage media within the degrading storage device. In some embodiments, the PEC response threshold for reconditioning may be a second and higher PEC response threshold that operates in addition to one or more lower PEC thresholds for reducing load allocation to degrading storage devices in accordance with method 800.

Figure 11:
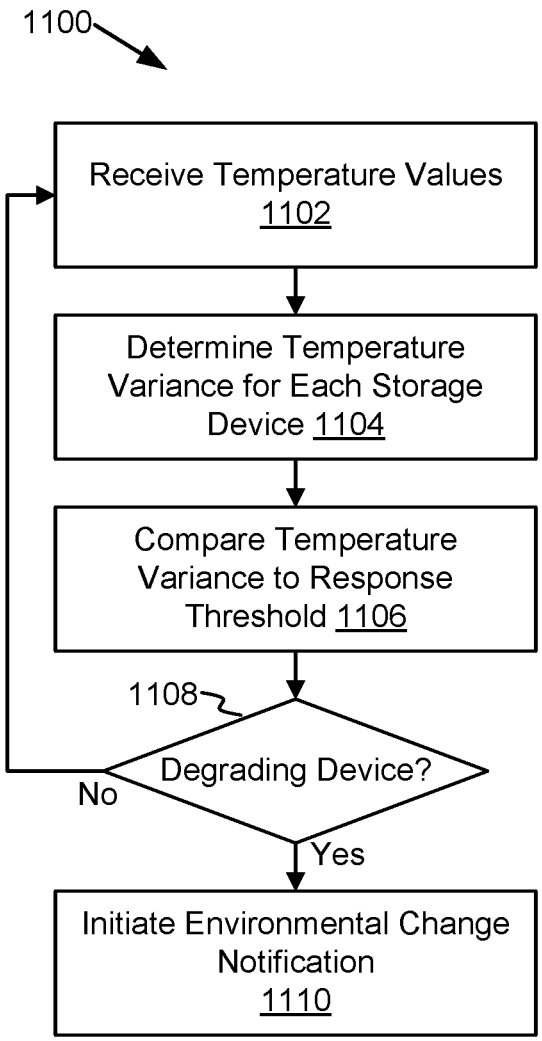
FIG. 11 is a flowchart of an example method of using storage device temperature to manage degrading storage devices.

As shown in FIG. 11, storage system 500 may be operated according to an example method of using temperature values for individual storage devices to manage degrading storage devices, i.e. according to method 1100 illustrated by blocks 1102-1110 in FIG. 11.

At block 1102, temperature values may be received for the storage devices. For example, a storage device monitor may receive temperature values from one or more thermal sensors associated with each storage device, such as a controller board-mounted thermistor, thermistor within storage media packages within each storage device, and/or a thermistor external to the storage device and associated with its backplane interface or rack and slot position.

At block 1104, temperature variance values for each storage device may be determined. For example, a variance calculator may process the temperature parameter value for each storage device and the aggregate baseline value for temperature across the set of storage devices to determine a temperature variance value for that storage device.

At block 1106, the temperature variance values may be compared to response thresholds to identify degrading devices and/or other responses. For example, a variance comparator may compare the temperature variance values calculated for each storage device against one or more corresponding response thresholds that defines degrading storage devices and response logic for responding to the temperature performance variance.

At block 1108, whether there are degrading storage devices among the set of storage devices based on temperature performance variance may be determined. If a temperature response threshold is met, then the storage device has been identified as a degrading storage device and method 1100 may continue to block 1110 to respond to the temperature-based degradation. If the response threshold is not met, then the storage devices have not reached the response threshold for block 1110 and method 1100 may return to block 1102 to continue monitoring storage devices for temperature performance variances that identify degrading storage devices.

At block 1110, a environmental change notification for the degrading storage device(s) may be initiated. For example, response logic based on the temperature response threshold met may initiate an environmental change notification targeting an environmental control system for a cooling system configured to target the degrading storage device. In some embodiments, the temperature response threshold for environmental change notification may be a second temperature response threshold that operates in addition to one or more temperature thresholds for reducing load allocation to degrading storage devices in accordance with method 800.

Figure 12:
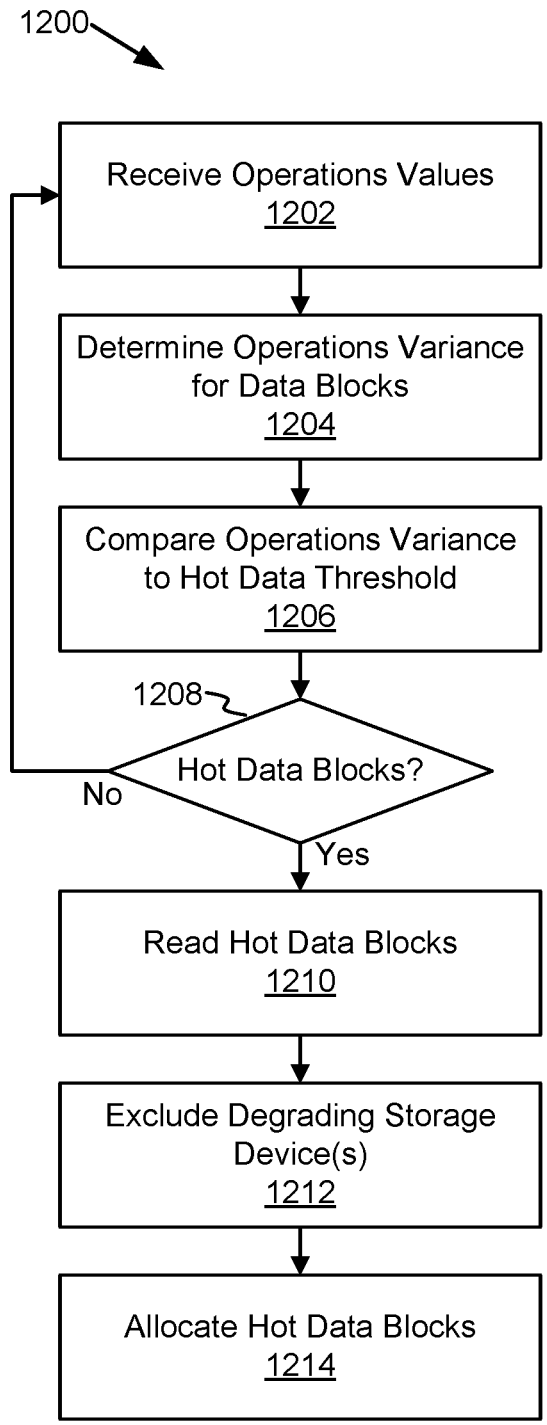
FIG. 12 is a flowchart of an example method of managing hot data blocks.

As shown in FIG. 12, storage system 500 may be operated according to an example method of managing hot data blocks directed to the set of storage devices that may include degrading storage devices, i.e. according to method 1200 illustrated by blocks 1202-1214 in FIG. 12.

At block 1202, operations values may be received for the storage devices. For example, a storage device monitor may receive operations values, such as IOPS, associated with data operations to each the storage devices. These operations values may be received from the storage devices and/or calculated by a storage manager or other controller component that monitors data operations allocated to individual storage devices.

At block 1204, operations variance values for each data block or set of data blocks may be determined. For example, a variance calculator may process the operations parameter value for the data blocks in each storage device and the aggregate baseline value for operations across the set of storage devices to determine an operations variance value for the data blocks stored on a storage device and/or subsets thereof.

At block 1206, the operations variance values may be compared to a hot data block threshold to identify hot data blocks. For example, a variance comparator may compare the operations variance values calculated for data blocks against one or more corresponding hot data thresholds that define hot data blocks and response logic for responding to the data operations variance across data blocks and storage devices storing them.

At block 1208, whether there are hot data blocks among the set of storage devices based on operations variance may be determined. If a hot data threshold is met, then the corresponding data blocks have been identified as hot data blocks and method 1200 may continue to block 1210 to respond to the hot data blocks. If the hot data threshold is not met, then the data blocks have not reached the hot data threshold for block 1210 and method 1200 may return to block 1202 to continue monitoring storage devices for operations variances that identify hot data blocks.

At block 1210, the hot data blocks may be read from the storage devices in which they are stored to initiate a data rotation. For example, response logic based on the hot data threshold met may initiate a data rotator to read the hot data blocks and initiate a write operation for the hot data blocks through the load balancer to redistribute the hot data blocks.

At block 1212, degrading storage devices may be excluded or receive a reduced allocation of hot data blocks. In some embodiments, method 1200 may operate in parallel with method 800 (as well as methods 900, 1000, and 1100) such that degrading storage devices may be identified and receive lower allocations of data operations or be excluded from receiving new storage operations. For example, the load balancer may exclude degrading storage devices based on reduced allocations, secondary storage identifiers, and/or special handling instructions for the allocation of hot data blocks that excludes all storage devices with reduced load allocations from receiving any hot data blocks being rotated (not just a reduced allocation of hot data blocks).

At block 1214, the hot data blocks may be allocated and stored to the storage devices. For example, the load balancer may select target storage devices based on the load balancing algorithm, load allocation values, and/or any special handling logic for hot data blocks (as described with regard to block 1212).

While at least one exemplary embodiment has been presented in the foregoing detailed description of the technology, it should be appreciated that a vast number of variations may exist. It should also be appreciated that an exemplary embodiment or exemplary embodiments are examples, and are not intended to limit the scope, applicability, or configuration of the technology in any way. Rather, the foregoing detailed description will provide those skilled in the art with a convenient road map for implementing an exemplary embodiment of the technology, it being understood that various modifications may be made in a function and/or arrangement of elements described in an exemplary embodiment without departing from the scope of the technology, as set forth in the appended claims and their legal equivalents.

As will be appreciated by one of ordinary skill in the art, various aspects of the present technology may be embodied as a system, method, or computer program product. Accordingly, some aspects of the present technology may take the form of an entirely hardware embodiment, an entirely software embodiment (including firmware, resident software, micro-code, etc.), or a combination of hardware and software aspects that may all generally be referred to herein as a circuit, module, system, and/or network. Furthermore, various aspects of the present technology may take the form of a computer program product embodied in one or more computer-readable mediums including computer-readable program code embodied thereon.

Any combination of one or more computer-readable mediums may be utilized. A computer-readable medium may be a computer-readable signal medium or a physical computer-readable storage medium. A physical computer readable storage medium may be, for example, but not limited to, an electronic, magnetic, optical, crystal, polymer, electromagnetic, infrared, or semiconductor system, apparatus, or device, etc., or any suitable combination of the foregoing. Non-limiting examples of a physical computer-readable storage medium may include, but are not limited to, an electrical connection including one or more wires, a portable computer diskette, a hard disk, random access memory (RAM), read-only memory (ROM), an erasable programmable read-only memory (EPROM), an electrically erasable programmable read-only memory (EEPROM), a Flash memory, an optical fiber, a compact disk read-only memory (CD-ROM), an optical processor, a magnetic processor, etc., or any suitable combination of the foregoing. In the context of this document, a computer-readable storage medium may be any tangible medium that can contain or store a program or data for use by or in connection with an instruction execution system, apparatus, and/or device.

Computer code embodied on a computer-readable medium may be transmitted using any appropriate medium, including but not limited to, wireless, wired, optical fiber cable, radio frequency (RF), etc., or any suitable combination of the foregoing. Computer code for carrying out operations for aspects of the present technology may be written in any static language, such as the C programming language or other similar programming language. The computer code may execute entirely on a user's computing device, partly on a user's computing device, as a stand-alone software package, partly on a user's computing device and partly on a remote computing device, or entirely on the remote computing device or a server. In the latter scenario, a remote computing device may be connected to a user's computing device through any type of network, or communication system, including, but not limited to, a local area network (LAN) or a wide area network (WAN), Converged Network, or the connection may be made to an external computer (e.g., through the Internet using an Internet Service Provider).

Various aspects of the present technology may be described above with reference to flowchart illustrations and/or block diagrams of methods, apparatus, systems, and computer program products. It will be understood that each block of a flowchart illustration and/or a block diagram, and combinations of blocks in a flowchart illustration and/or block diagram, can be implemented by computer program instructions. These computer program instructions may be provided to a processing device (processor) of a general purpose computer, special purpose computer, or other programmable data processing apparatus to produce a machine, such that the instructions, which can execute via the processing device or other programmable data processing apparatus, create means for implementing the operations/acts specified in a flowchart and/or block(s) of a block diagram.

Some computer program instructions may also be stored in a computer-readable medium that can direct a computer, other programmable data processing apparatus, or other device(s) to operate in a particular manner, such that the instructions stored in a computer-readable medium to produce an article of manufacture including instructions that implement the operation/act specified in a flowchart and/or block(s) of a block diagram. Some computer program instructions may also be loaded onto a computing device, other programmable data processing apparatus, or other device(s) to cause a series of operational steps to be performed on the computing device, other programmable apparatus or other device(s) to produce a computer-implemented process such that the instructions executed by the computer or other programmable apparatus provide one or more processes for implementing the operation(s)/act(s) specified in a flowchart and/or block(s) of a block diagram.

A flowchart and/or block diagram in the above figures may illustrate an architecture, functionality, and/or operation of possible implementations of apparatus, systems, methods, and/or computer program products according to various aspects of the present technology. In this regard, a block in a flowchart or block diagram may represent a module, segment, or portion of code, which may comprise one or more executable instructions for implementing one or more specified logical functions. It should also be noted that, in some alternative aspects, some functions noted in a block may occur out of an order noted in the figures. For example, two blocks shown in succession may, in fact, be executed substantially concurrently, or blocks may at times be executed in a reverse order, depending upon the operations involved. It will also be noted that a block of a block diagram and/or flowchart illustration or a combination of blocks in a block diagram and/or flowchart illustration, can be implemented by special purpose hardware-based systems that may perform one or more specified operations or acts, or combinations of special purpose hardware and computer instructions.

While one or more aspects of the present technology have been illustrated and discussed in detail, one of ordinary skill in the art will appreciate that modifications and/or adaptations to the various aspects may be made without departing from the scope of the present technology, as set forth in the following claims.

The invention claimed is:

1. A storage system, comprising:
a storage system manager configured to:
  manage a plurality of storage devices configured for data access through a common data stream; and
  distribute data operations from the common data stream to the plurality of storage devices;
a storage device monitor configured to:
  receive, for each storage device of the plurality of storage devices, a grown bad block value;
  determine, for each storage device of the plurality of storage devices, a first variance value based on grown bad block values from the plurality of storage devices;
  determine, based on the first variance value, a degrading storage device that has increased grown bad blocks relative to the plurality of storage devices;
  receive an overprovisioning value for the degrading storage device; and
  determine, based on the overprovisioning value, that the degrading storage device has remaining overprovisioning space below an overprovisioning response threshold; and
a load balancer configured to:
  determine, using a load balancing algorithm, target storage devices among the plurality of storage devices to receive data operations from the common data stream;
  reduce, responsive to the determination of the degrading storage device, a load allocation of data operations distributed to the degrading storage device;
  allocate, responsive to the remaining overprovisioning space being below the overprovisioning response threshold, the degrading storage device to a secondary storage status; and
  skip the degrading storage device for distribution of write data operations from the common data stream.

2. The storage system of claim 1, wherein:
the load balancing algorithm is configured to distribute data operations evenly across the plurality of storage devices by selecting target storage devices for data operations based on load allocation values for each storage device of the plurality of storage devices; and
reducing the load allocation of data operations distributed to the degrading storage device is based on changing a load allocation value for the degrading storage device in the load balancing algorithm.

3. The storage system of claim 1, wherein the storage device monitor is further configured to:
receive, for each storage device of the plurality of storage devices, a program erase cycle value;
determine, for each storage device of the plurality of storage devices, a second variance value based on program erase cycle values from the plurality of storage devices; and
determine, based on the second variance value, that the degrading storage device has increased program erase cycles relative to the plurality of storage devices.

4. The storage system of claim 3, wherein the storage system manager is further configured to initiate, responsive to the degrading storage device having increased program erase cycles, a reconditioning process to rewrite data blocks stored on the degrading storage device to the degrading storage device.

5. The storage system of claim 1, wherein the storage device monitor is further configured to:
receive, for each storage device of the plurality of storage devices, a temperature value;
determine, for each storage device of the plurality of storage devices, a third variance value based on temperature values from the plurality of storage devices; and
determine, based on the third variance value, that the degrading storage device has increased temperature relative to the plurality of storage devices.

6. The storage system of claim 5, wherein the storage system manager is further configured to initiate, responsive to the degrading storage device having increased temperature, an environmental change notification to a cooling system associated with the plurality of storage devices.

7. The storage system of claim 1, wherein the load balancer is further configured to:
identify a set of data blocks having associated data operations above a hot data threshold; and
allocate the set of data blocks across each of the plurality of storage devices, excluding the degrading storage device.

8. The storage system of claim 7, wherein:
the load balancer is further configured to rotate the set of data blocks from an initial storage device to the plurality of storage devices, excluding the degrading storage device; and
the load balancer selected the initial storage device to receive the associated data operations for the set of data blocks.

9. The storage system of claim 1, further comprising:
a storage device performance parameter table configured to store, for each storage device of the plurality of storage devices, performance parameters received from the plurality of storage devices, wherein:
  the storage device monitor is further configured to determine the first variance value based on:

aggregating each grown bad block value in successive table entries for each storage device of the plurality of storage devices; and
comparing each grown bad block value to an aggregate value to determine the first variance value for each storage device of the plurality of storage devices; and
the performance parameters include at least one of:
grown bad block values;
program erase cycle values;
temperature values; and
data operations values.

10. A computer-implemented method, comprising:
managing a plurality of storage devices configured for data access through a common data stream;
distributing data operations from the common data stream to the plurality of storage devices;
determining, using a load balancing algorithm, target storage devices among the plurality of storage devices to receive data operations from the common data stream;
receiving, for each storage device of the plurality of storage devices, a grown bad block value;
receiving, for each storage device of the plurality of storage devices, a temperature value;
determining, for each storage device of the plurality of storage devices, a first variance value based on grown bad block values from the plurality of storage devices;
determining, for each storage device of the plurality of storage devices, a third variance value based on temperature values from the plurality of storage devices;
determining, based on the first variance value, a degrading storage device that has increased grown bad blocks relative to the plurality of storage devices;
determining, based on the third variance value, that the degrading storage device has increased temperature relative to the plurality of storage devices; and
reducing, responsive to determining that the degrading storage device has increased temperature relative to the plurality of storage devices, a load allocation of data operations distributed to the degrading storage device.

11. The computer-implemented method of claim 10, further comprising:
receiving an overprovisioning value for the degrading storage device;
determining, based on the overprovisioning value, that the degrading storage device has remaining overprovisioning space below an overprovisioning response threshold;
allocating, responsive to the remaining overprovisioning space being below the overprovisioning response threshold, the degrading storage device to a secondary storage status; and
skipping, based on the secondary storage status, the degrading storage device for distribution of write data operations from the common data stream.

12. The computer-implemented method of claim 10, wherein:
determining target storage devices includes distributing data operations evenly across the plurality of storage devices by selecting target storage devices for data operations based on load allocation values for each storage device of the plurality of storage devices; and
reducing the load allocation of data operations distributed to the degrading storage device is based on changing a load allocation value for the degrading storage device in the load balancing algorithm.

13. The computer-implemented method of claim 10, further comprising:
receiving, for each storage device of the plurality of storage devices, a program erase cycle value;
determining, for each storage device of the plurality of storage devices, a second variance value based on program erase cycle values from the plurality of storage devices; and
determining, based on the second variance value, that the degrading storage device has increased program erase cycles relative to the plurality of storage devices.

14. The computer-implemented method of claim 13, further comprising:
initiating, responsive to the degrading storage device having increased program erase cycles, a reconditioning process to rewrite data blocks stored on the degrading storage device to the degrading storage device.

15. The computer-implemented method of claim 10, further comprising:
initiating, responsive to the degrading storage device having increased temperature, an environmental change notification to a cooling system associated with the plurality of storage devices.

16. The computer-implemented method of claim 10, further comprising:
identifying a set of data blocks having associated data operations above a hot data threshold; and
allocating the set of data blocks across each of the plurality of storage devices, excluding the degrading storage device.

17. The computer-implemented method of claim 16, further comprising:
rotating, from an initial storage device among the plurality of storage devices, the set of data blocks to the plurality of storage devices, excluding the degrading storage device, wherein the initial storage device received the associated data operations for the set of data blocks.

18. A system, comprising:
a plurality of storage devices configured for data access through a common data stream;
means for distributing data operations from the common data stream to the plurality of storage devices;
means for determining, using a load balancing algorithm, target storage devices among the plurality of storage devices to receive data operations from the common data stream;
means for receiving, for each storage device of the plurality of storage devices, a grown bad block value;
means for receiving, for each storage device of the plurality of storage devices, a program erase cycle value;
means for determining, for each storage device of the plurality of storage devices, a first variance value based on grown bad block values from the plurality of storage devices;
means for determining, for each storage device of the plurality of storage devices, a second variance value based on program erase cycle values from the plurality of storage devices;
means for determining, based on the first variance value, a degrading storage device that has increased grown bad blocks relative to the plurality of storage devices;
means for determining, based on the second variance value, that the degrading storage device has increased program erase cycles relative to the plurality of storage devices; and means for reducing, responsive to determining that the degrading storage device has increased program erase cycles relative to the plurality of storage devices, a load allocation of data operations distributed to the degrading storage device.

19. The system of claim 18, further comprising:

means for initiating, responsive to the degrading storage device having increased program erase cycles, a reconditioning process to rewrite data blocks stored on the degrading storage device to the degrading storage device.

20. The system of claim 18, further comprising:

means for receiving an overprovisioning value for the degrading storage device;

means for determining, based on the overprovisioning value, that the degrading storage device has remaining overprovisioning space below an overprovisioning response threshold;

means for allocating, responsive to the remaining overprovisioning space being below the overprovisioning response threshold, the degrading storage device to a secondary storage status; and means for skipping, based on the secondary storage status, the degrading storage device for distribution of write data operations from the common data stream.

* * * * *